US012787327B2

(12) United States Patent
Chen et al.

(10) Patent No.: US 12,787,327 B2
(45) Date of Patent: Nov. 3, 2026

(54) SEMICONDUCTOR DEVICE STRUCTURE AND METHOD FOR FORMING THE SAME

(71) Applicant: Taiwan Semiconductor Manufacturing Company, Ltd., Hsinchu (TW)

(72) Inventors: Hong-Chih Chen, Changhua County (TW); Fu-Hsiang Su, Zhubei City (TW); Chia-Hao Kuo, Taoyuan City (TW); Wen-Li Chiu, Kaohsiung City (TW); Jhon-Jhy Liaw, Zhudong Township, Hsinchu County (TW); Shih-Hsun Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 370 days.

(21) Appl. No.: 18/632,929

(22) Filed: Apr. 11, 2024

(65) Prior Publication Data

US 2025/0324629 A1 Oct. 16, 2025

(51) Int. Cl.

| | |
|---|---|
| ***H10D 30/01*** | (2025.01) |
| ***H10D 30/43*** | (2025.01) |
| ***H10D 30/67*** | (2025.01) |
| ***H10D 62/10*** | (2025.01) |

(52) U.S. Cl.
CPC ........... *H10D 30/014* (2025.01); *H10D 30/43* (2025.01); *H10D 30/6735* (2025.01); *H10D 62/121* (2025.01)

(58) Field of Classification Search
CPC .. H10D 30/014; H10D 30/43; H10D 30/6735; H10D 62/121; H10D 64/017; H10D 30/6757; H10D 62/822
See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |

(Continued)

*Primary Examiner* — Karen Kusumakar
(74) *Attorney, Agent, or Firm* — Birch, Stewart, Kolasch & Birch, LLP

(57) ABSTRACT

A method for forming a semiconductor device structure includes forming a fin structure over a substrate. The method also includes forming a gate structure across the fin structure. The method also includes forming source/drain epitaxial structures over opposite sides of the gate structure. The method also includes forming a hard mask layer over the gate structure and the source/drain epitaxial structures. The method also includes removing a portion of the hard mask layer and the gate structure to form an opening. The method also includes laterally etching the gate structure to enlarge the opening under the hard mask layer. The method also includes depositing a shell material in the opening. The method also includes etching back the shell material to form a shell structure under the hard mask layer. The method also includes forming an isolation gate structure in the opening.

20 Claims, 36 Drawing Sheets

(56) References Cited

U.S. PATENT DOCUMENTS

| | | | | |
|---|---|---|---|---|
| 9,576,814 | B2 | 2/2017 | Wu et al. | |
| 9,608,116 | B2 | 3/2017 | Ching et al. | |
| 2017/0194480 | A1* | 7/2017 | Chen .................... | H10D 30/024 |
| 2025/0006810 | A1* | 1/2025 | Koh ..................... | H10D 30/014 |

* cited by examiner

10e

SEMICONDUCTOR DEVICE STRUCTURE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or ILD structures, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure which can extend around the channel region providing access to the channel on two or four sides. GAA devices are compatible with conventional complementary metal-oxide-semiconductor (CMOS) processes.

However, the integration of fabrication of the GAA features around the nanowire can be challenging. While the current methods have been satisfactory in many respects, continued improvements are still needed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 1F-1, 1F-2, 1G-1, 1G-2, 1H-1, 1H-2, 1I-1, 1I-2, 1J-1, 1J-2, 1K-1, 1K-2, 1L-1, 1L-2, 1M-1, 1M-2 are cross-sectional representations of various stages of forming a semiconductor device structure, in accordance with some embodiments of the disclosure.

FIG. 2 is cross-sectional representation of a semiconductor device structure, in accordance with some embodiments of the disclosure.

FIGS. 5C, 5C-1 are cross-sectional representations of various stages of forming a semiconductor device structure, in accordance with some embodiments of the disclosure.

DETAILED DESCRIPTION

Figure 1A:
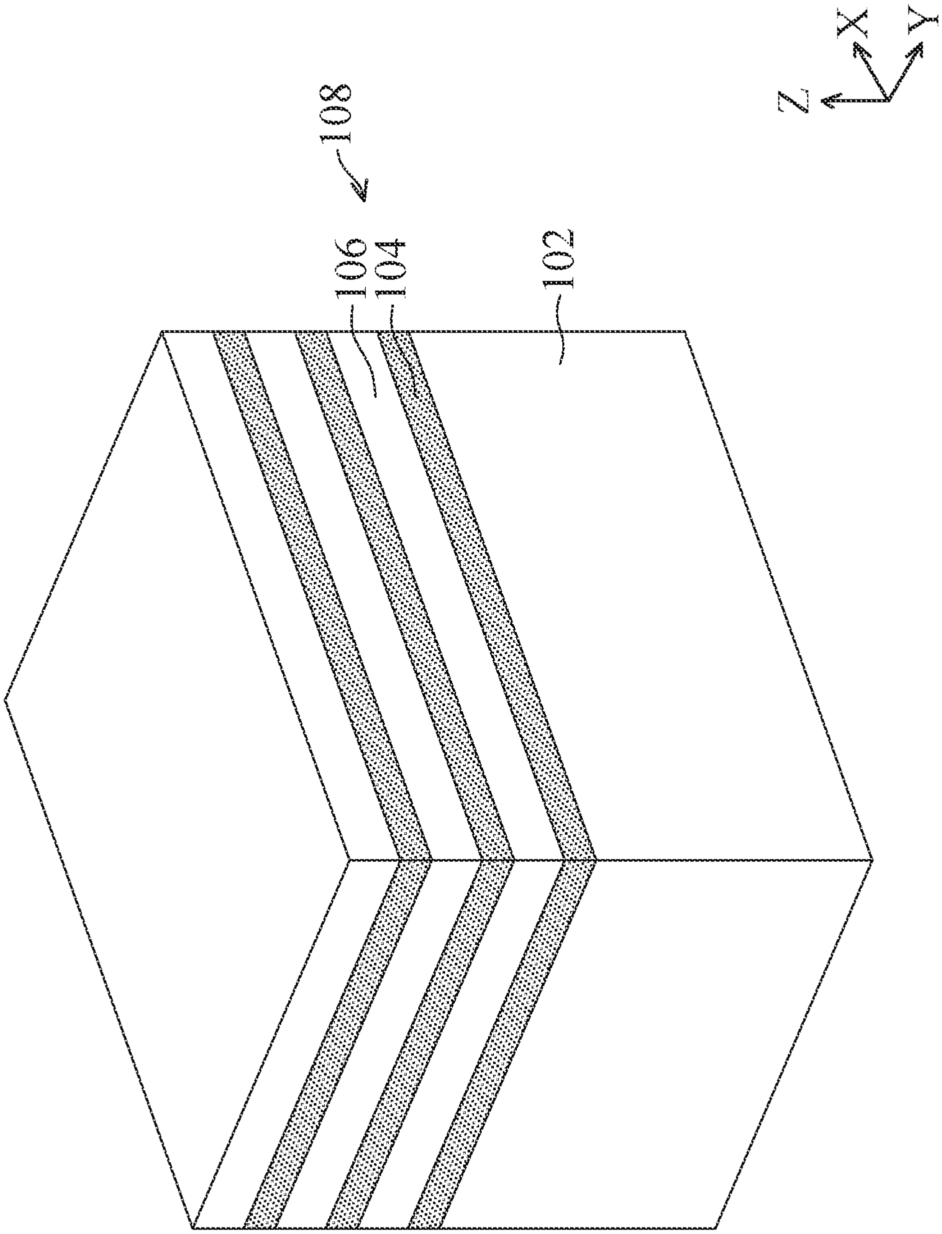
FIGS. 1A-1D, 1E, 1F, 1G, 1H, 1I, 1J, 1K, 1L, 1M are perspective representations of various stages of forming a semiconductor device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

The nanostructure transistor (e.g. nanosheet transistor, nanowire transistor, multi-bridge channel, nano-ribbon FET, forksheet structures, gate all around (GAA) transistor structures) described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanostructures.

Embodiments for forming a semiconductor device structure are provided. The method for forming the semiconductor device structure may include forming a shell structure over the sidewalls of the isolation gate structure. Therefore, the isolation gate structure may not be damaged when forming the gate structure. The leakage current may be reduced.

The semiconductor device structure may include various active devices. For example, the semiconductor device structure may include gate all around (GAA) structures. The semiconductor device structure may also include channel structures such as nanosheet structures, forksheet structures, and CFET structures. The semiconductor device structure may also include FinFET structures, or Si and SiGe planar transistors. The semiconductor device structure may include a gate blocking structure.

The semiconductor device structure 10*a* may be a nanostructure transistor. FIGS. 1A-1D, 1E, 1F, 1G, 1H, 1I, 1J, 1K, 1L, 1M are perspective representations of various stages of forming a semiconductor device structure 10*a*, in accordance with some embodiments of the disclosure. FIGS. 1F-1, 1F-2, 1G-1, 1G-2, 1H-1, 1H-2, 1I-1, 1I-2, 1J-1, 1J-2, 1K-1, 1K-2, 1L-1, 1L-2, 1M-1, 1M-2 are cross-sectional representations of various stages of forming a semiconductor device structure 10*a*, in accordance with some embodiments of the disclosure. FIGS. 1F-1, 1G-1, 1H-1, 1I-1, 1J-1, 1K-1, 1L-1, 1M-1 show cross-sectional representations taken along line 1-1 in FIG. 1E. FIGS. 1F-2, 1G-2, 1H-2, 1I-2, 1J-2, 1K-2, 1L-2, 1M-2 show cross-sectional representations taken along line 2-2 in FIG. 1E.

A semiconductor stack 108 including first semiconductor material layers 104 and second semiconductor material layers 106 are formed over a substrate 102, as shown in FIG. 1A in accordance with some embodiments. The substrate 102 may be a semiconductor wafer such as a silicon wafer. The substrate 102 may also include other elementary semiconductor materials, compound semiconductor materials, alloy semiconductor materials, or a combination thereof. Examples of elementary semiconductor materials include, but are not limited to, crystal silicon, polycrystalline silicon, amorphous silicon, germanium, diamond, and combinations thereof. Examples of compound semiconductor materials include, but are not limited to, silicon carbide, gallium nitride, gallium arsenic, gallium phosphide, indium phosphide, indium arsenide, indium antimonide, and combinations thereof. Examples of alloy semiconductor materials include, but are not limited to, SiGe, GaAsP, AlInAs, AlGaAs, GaInAs, GaInP, GaInAsP, and combinations thereof. The substrate 102 may include an epitaxial layer. For example, the substrate 102 may be an epitaxial layer overlying a bulk semiconductor. In addition, the substrate 102 may also be semiconductor on insulator (SOI). The SOI substrate may be fabricated by a wafer bonding process, a silicon film transfer process, a separation by implantation of oxygen (SIMOX) process, other applicable methods, or a combination thereof. The substrate 102 may be an N-type substrate. The substrate 102 may be a P-type substrate.

Next, first semiconductor material layers 104 and second semiconductor material layers 106 are alternating stacked over the substrate 102 to form the semiconductor stack 108, as shown in FIG. 1A in accordance with some embodiments. The first semiconductor material layers 104 and the second semiconductor material layers 106 may include Si, Ge, SiGe, GaAs, InSb, GaP, GaSb, InAlAs, InGaAs, GaSbP, GaAsSb, or InP. The first semiconductor material layers 104 and second semiconductor material layers 106 may be made of different materials with different etching rates. In some embodiments, the first semiconductor material layers 104 are made of SiGe and the second semiconductor material layers 106 are made of Si.

The first semiconductor material layers 104 and second semiconductor material layers 106 may be formed by low pressure chemical vapor deposition (LPCVD) process, epitaxial growth process, other applicable methods, or a combination thereof. The epitaxial growth process may include molecular beam epitaxy (MBE), metal organic chemical vapor deposition (MOCVD), or vapor phase epitaxy (VPE).

It should be noted that, although there are three layers of the first semiconductor material layers 104 and three layers of the second semiconductor material layers 106 shown in FIG. 1A, the number of the first semiconductor material layers 104 and second semiconductor material layers 106 are not limited herein, depending on the demand of performance and process. For example, the semiconductor structure may include two to five layers of the first semiconductor material layers 104 and two to five layers of the second semiconductor material layers 106.

Next, a mask structure may be formed over the semiconductor stack 108. The mask structure may be a multilayer structure including a pad layer and a hard mask layer formed over the pad layer. The pad layer may be made of silicon oxide, which may be formed by thermal oxidation or CVD. The hard mask layer may be made of silicon nitride, which may be formed by CVD, such as LPCVD or plasma-enhanced CVD (PECVD).

Figure 1B:
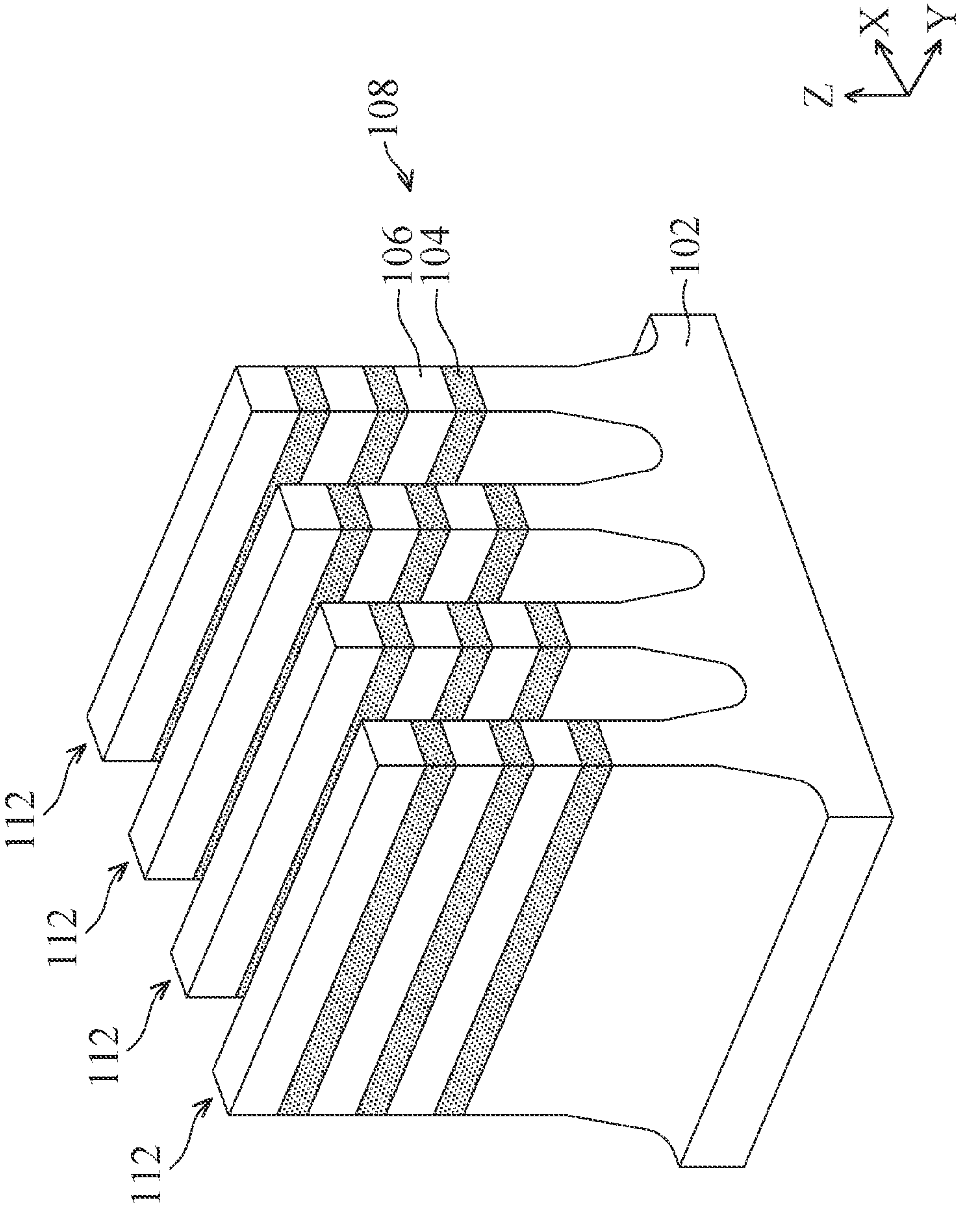

After the first semiconductor material layers 104 and the second semiconductor material layers 106 are formed as the semiconductor stack 108 over the substrate 102, the semiconductor stack 108 is patterned to form fin structures 112 using the mask structure as a mask layer, as shown in FIG. 1B in accordance with some embodiments. The fin structures 112 may include base fin structures and the semiconductor stack 108, including the first semiconductor material layers 104 and the second semiconductor material layers 106, formed over the base fin structure.

The patterning process may include forming a mask structure over the first semiconductor material layers 104 and the second semiconductor material layers 106 and etching the semiconductor stack 108 and the underlying substrate 102 through the mask structure.

The patterning process of forming the fin structures 112 may include a photolithography process and an etching process. The photolithography process may include photoresist coating (e.g., spin-on coating), soft baking, mask aligning, exposure, post-exposure baking, developing the photoresist, rinsing and drying (e.g., hard baking). The etching process may include a dry etching process or a wet etching process.

Figure 1C:
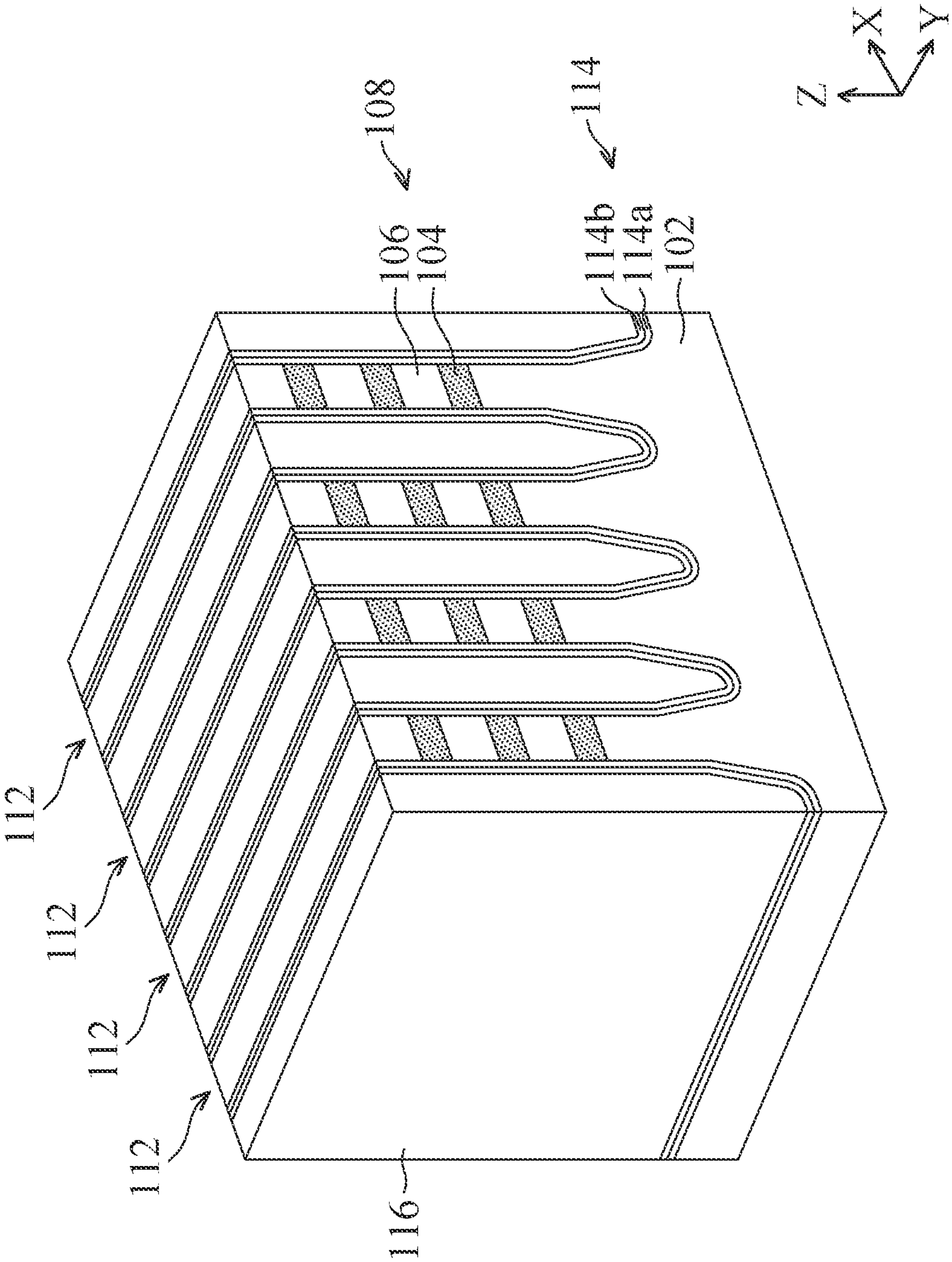

After the fin structures 112 are formed, liner layers 114 are formed over the fin structures 112 and in the trenches between the fin structures 112, as shown in FIG. 1C in accordance with some embodiments. The liner layers 114 may be conformally formed over the substrate 102, the fin structures 112, and the mask structure covering the fin structures 112. The liner layers 114 may be used to protect the fin structures 112 from being damaged in the following processes (such as an anneal process or an etching process). The liner layers 114 may be a multi-layer structure including the liner layers 114*a* and 114*b*. The liner layers 114 may be made of silicon nitride, silicon oxide, other suitable materials, or a combination thereof. The liner layers 114 may be formed using thermal oxidation, a CVD process, an atomic layer deposition (ALD) process, an LPCVD process, a plasma enhanced CVD (PECVD) process, an HDPCVD process, a flowable CVD (FCVD) process, another applicable process, or a combination thereof.

Next, an isolation material 116 is then filled into the trenches between the fin structures 112 and over the liner layers 114, as shown in FIG. 1C in accordance with some embodiments. The isolation material 116 may be made of silicon oxide, silicon nitride, silicon oxynitride (SiON), fluoride-doped silicate glass (FSG), other low-k dielectric materials, or a combination thereof. The isolation material 116 may be deposited by a deposition process, such as a chemical vapor deposition (CVD) process (e.g. a flowable CVD (FCVD) process), a spin-on-glass process, or another applicable process.

Next, the hard mask layer over the fin structures 112 may be removed, and the pad layer over the fin structures 112 may be exposed. The hard mask layer may be removed by performing a planarization process such as a chemical mechanical polishing (CMP) process.

Figure 1D:
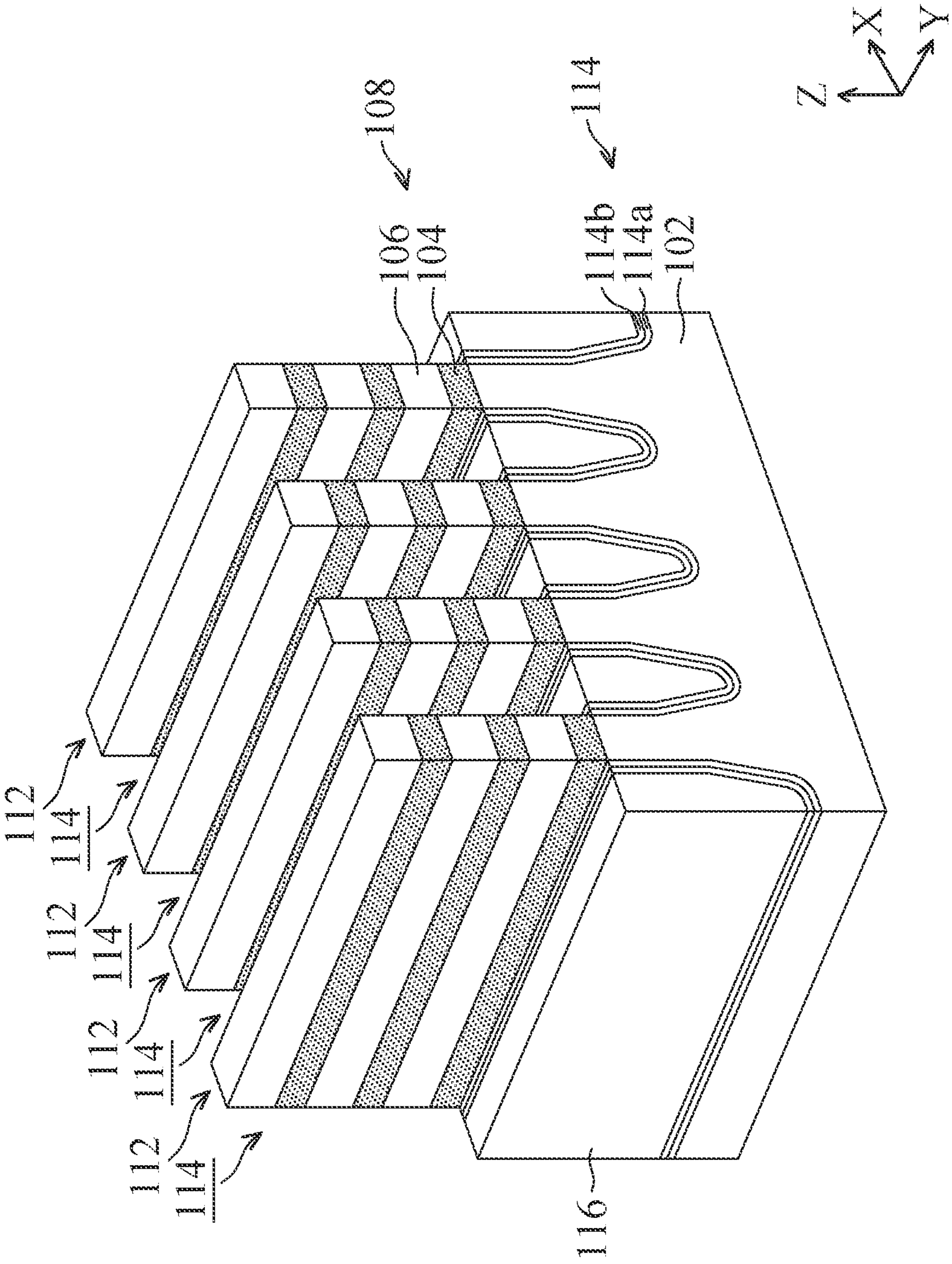

Next, the isolation material 116 is etched back using an etching process, and an isolation structure 116 is formed surrounding the base fin structure, as shown in FIG. 1D in accordance with some embodiments. The etching process may be used to remove the top portion of the isolation material 116. The pad layer over the fin structure 112 may be removed in the etching process. As a result, the semiconductor stack 108 may be exposed. The isolation structure 116 may be a shallow trench isolation (STI) structure 116. The isolation structure 116 may be configured to electrically isolate active regions such as fin structures 112 of the semiconductor structure 10*a* and prevent electrical interference and crosstalk.

Figure 1E:
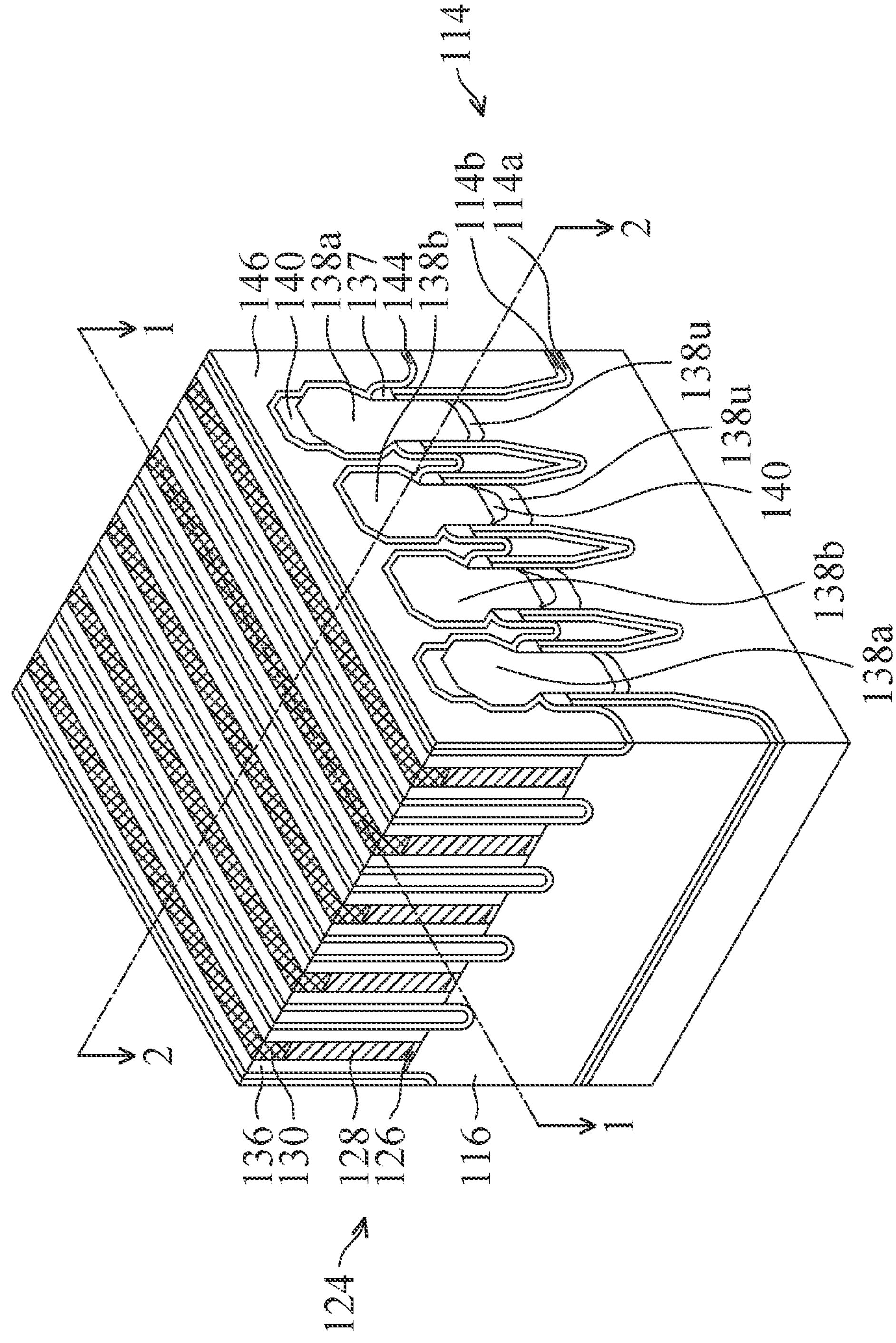

Next, a dummy gate structure 124 is formed over and across the fin structures 112, as shown in FIG. 1E in accordance with some embodiments. The dummy gate structure 124 may be used to define the source/drain regions and the channel regions of the resulting semiconductor structure 10*a*. The dummy gate structure 124 may include a dummy gate dielectric layer 126 and a dummy gate electrode layer 128. The dummy gate dielectric layer 126 and the dummy gate electrode layer 128 may be replaced by the following steps to form a real gate structure with a high-k dielectric layer and a metal gate electrode layer.

The dummy gate dielectric layer 126 may include one or more dielectric materials, such as silicon oxide, silicon nitride, silicon oxynitride (SiON), $HfO_2$, HfZrO, HfSiO, HfTIO, HfAlO, or a combination thereof. The dummy gate dielectric layer 126 may be formed by an oxidation process (e.g., a dry oxidation process, or a wet oxidation process), a chemical vapor deposition process, other applicable processes, or a combination thereof. Alternatively, the dummy gate dielectric layer 126 may include a high-k dielectric layer (e.g., the dielectric constant is greater than 3.9) such as hafnium oxide ($HfO_2$). Alternatively, the high-k dielectric layer may include other high-k dielectrics, such as LaO, AlO, ZrO, TiO, $Ta_2O_5$, $Y_2O_3$, $SrTiO_3$, $BaTiO_3$, BaZrO, HfZrO, HfLaO, HfTaO, HfSiO, HfSiON, HfTIO, LaSiO, AlSiO, (Ba, Sr)$TiO_3$, $Al_2O_3$, other applicable high-k dielectric materials, or a combination thereof. The high-k dielectric layer may be formed by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

The dummy gate electrode layer 128 may include polycrystalline-silicon (poly-Si), poly-crystalline silicon-germanium (poly-SiGe), other applicable materials, or a combination thereof. The dummy gate electrode layer 128 may be formed by a chemical vapor deposition process (e.g., a low pressure chemical vapor deposition process, or a plasma enhanced chemical vapor deposition process), a physical vapor deposition process (e.g., a vacuum evaporation process, or a sputtering process), other applicable processes, or a combination thereof.

Next, a hard mask layer 130 is formed over the dummy gate structure 124, as shown in FIG. 1E in accordance with some embodiments. The hard mask layer 130 may include multiple layers, such as an oxide layer and a nitride layer. In some embodiments, the oxide layer includes silicon oxide, and the nitride layer includes silicon nitride.

The formation of the dummy gate structure 124 may include conformally forming a dielectric material as the dummy gate dielectric layer 126. Afterwards, a conductive material may be formed over the dielectric material as the dummy gate electrode layer 128. The hard mask layer 130, including the oxide layer and the nitride layer, may be formed over the conductive material. Next, the dielectric material and the conductive material may be patterned and etched through the hard mask layer 130 to form the dummy gate structure 124, as shown in FIG. 1E in accordance with some embodiments. The dummy gate dielectric layer 126 and the dummy gate electrode layer 128 may be etched by a dry etching process. After the etching process, the first semiconductor material layers 104 and the second semiconductor material layers 106 may be exposed at opposite sides of the dummy gate structure 124.

Next, a conformal dielectric layer is formed over the substrate 102 and the dummy gate structure 124, and then an etching process is performed. A pair of gate spacer layers 136 is formed over opposite sidewalls of the dummy gate structure 124, as shown in FIG. 1E in accordance with some embodiments.

The gate spacer layers 136 may be multi-layer structures formed by different materials with different etching selectivity. The gate spacer layers 136 may be made of silicon oxide, silicon nitride, silicon oxynitride, dielectric materials, or a combination thereof. The gate spacer layers 136 may be formed by a chemical vapor deposition (CVD) process, a spin-on-glass process, or another applicable process.

Next, a conformal dielectric layer is formed over the substrate 102, the dummy gate structure 124, and the fin structures 112, and then an etching process is performed. A pair of fin spacer layers 137 is formed over opposite sidewalls of the bottom portion of the fin structures 112, as shown in FIG. 1E in accordance with some embodiments. The fin spacer layers 137 may be made of silicon oxide, silicon nitride, silicon oxynitride, dielectric materials, or a combination thereof. The fin spacer layers 137 may be formed by a chemical vapor deposition (CVD) process, a spin-on-glass process, or another applicable process.

After the gate spacer layers 136 and the fin spacer layers 137 are formed, the first semiconductor material layers 104 and the second semiconductor material layers 106 of the fin structures 112 not covered by the dummy gate structure 124 and the gate spacer layers 136 are etched to form the source/drain opening beside the dummy gate structure 124. A recess may be formed in the isolation structure 116 when etching the first semiconductor material layers 104 and the second semiconductor material layers 106 of the fin structures 112.

The fin structures 112 may be recessed by performing a number of etching processes. That is, the first semiconductor material layers 104 and the second semiconductor material layers 106 of the fin structures 112 may be etched in different etching processes. The etching process may be a dry etching process or a wet etching process. The fin structures 112 may be etched by a dry etching process.

Next, the first semiconductor material layers 104 may be laterally etched from the source/drain opening to form recesses. The outer portions of the first semiconductor material layers 104 may be removed, and the inner portions of the first semiconductor material layers 104 under the dummy gate structure 124 and the gate spacer layers 136 may remain. After the lateral etching process, the sidewalls of the etched first semiconductor material layers 104 may be not aligned with the sidewalls of the second semiconductor material layers 106.

The lateral etching of the first semiconductor material layers 104 may be a dry etching process, a wet etching process, or a combination thereof. In some embodiments, the first semiconductor material layers 104 are Ge or SiGe and the second semiconductor material layers 106 are Si, and the first semiconductor material layers 104 are selectively etched to form the recesses by using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions, or the like.

Next, an inner spacer 139 may be formed in the recess. The inner spacer 139 may provide a barrier between subsequently formed source/drain epitaxial structures and gate structure. The inner spacer 139 may be made of a dielectric material such as silicon oxide ($SiO_2$), silicon nitride (SiN), silicon carbide (SiC), silicon oxynitride (SiON), silicon carbon nitride (SiCN), silicon oxide carbonitride (SiOCN), or a combination thereof. The inner spacer 139 may be formed using a deposition process. The deposition process may include a CVD process (such as LPCVD, PECVD, SACVD, or FCVD), an ALD process, another applicable method, or a combination thereof.

Next, an un-doped layer structure 138*u* is formed at the bottom of the source/drain opening, as shown in FIG. 1E in accordance with some embodiments. The un-doped layer structure 138*u* may be made of semiconductor material such as silicon or SiGe. The un-doped layer structure 138*u* may be formed by epitaxially depositing the un-doped layer material and etching back the deposited un-doped layer material. The un-doped layer structure 138*u* may be formed by an epitaxial growth step, such as metalorganic chemical vapor deposition (MOCVD), metalorganic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable method.

Next, a first source/drain epitaxial structure 138*a* is formed in the source/drain opening in the first region of the substrate 102, as shown in FIG. 1E in accordance with some embodiments. The first source/drain epitaxial structure 138*a* may be formed over opposite sides of the dummy gate structure 124. The first source/drain epitaxial structure 138*a* may refer to a source or a drain, individually or collectively dependent upon the context.

A strained material may be grown in the source/drain opening using an epitaxial (epi) process to form the first source/drain epitaxial structure 138*a*. In addition, the lattice constant of the strained material may be different from the lattice constant of the substrate 102. The first source/drain epitaxial structure 138*a* may include SiGeB, SiGe, other applicable materials, or a combination thereof. The first source/drain epitaxial structure 138*a* may be formed by an epitaxial growth step, such as metalorganic chemical vapor deposition (MOCVD), metalorganic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable method.

The first source/drain epitaxial structure 138*a* may be in-situ doped during the epitaxial growth process. For example, the first source/drain epitaxial structure 138*a* may be the epitaxially grown SiGe doped with boron (B). The first source/drain epitaxial structure 138*a* may be doped in one or more implantation processes after the epitaxial growth process.

The first source/drain epitaxial structure 138*a* may include a first portion 138*al* and a second portion 138*a*2. The first portion 138*al* may be formed over the sidewalls of the second semiconductor material layers 106 and the substrate 102, and the second portion 138*a*2 may be filled over the first portion 138*al* in the source/drain opening. The first portion 138*al* may be made of dielectric material such as silicon nitride, silicon oxide, silicon oxynitride (SiON), other applicable materials, or a combination thereof. The first portion 138*al* also may be made of un-doped or lower doped Si or SiGe. The second portion 138*a*2 may be doped SiGe. In some embodiments, the dopant concentration of the second portion 138*a*2 is higher than the dopant concentration of the first portion 138*a*1. Therefore, dopant out-diffusing issue may be prevented.

Next, an isolation layer 140 is formed over the first source/drain epitaxial structure 138*a* and in the source/drain opening in the second region of the substrate 102, as shown in FIG. 1E in accordance with some embodiments. The isolation layer 140 may provide isolation between the substrate 102 and the subsequently formed source/drain epitaxial structure. The isolation layer 140 may be made of a dielectric material such as silicon nitride, silicon oxide, silicon oxynitride (SiON), other applicable materials, or a combination thereof. The isolation layer 140 may be formed by CVD, PVD, ALD, spin-on coating, or another applicable process.

Next, a second source/drain epitaxial structure 138*b* is formed in the source/drain opening in the second region of the substrate 102, as shown in FIG. 1E in accordance with some embodiments. The second source/drain epitaxial structure 138*b* may refer to a source or a drain, individually or collectively dependent upon the context.

The second source/drain epitaxial structure 138*b* may include SiP, SiAs, other applicable materials, or a combination thereof. The processes for forming the second source/drain epitaxial structure 138*b* may be the same as, or similar to, those used to form the first source/drain epitaxial structure 138*a*. For the purpose of brevity, the descriptions of these processes are not repeated herein.

The second source/drain epitaxial structure 138*b* may be the epitaxially grown Si doped with carbon to form silicon: carbon (Si: C) source/drain features, phosphorous to form silicon: phosphor (Si: P) source/drain features, or both carbon and phosphorous to form silicon carbon phosphor (SiCP) source/drain features.

Figure 1F:
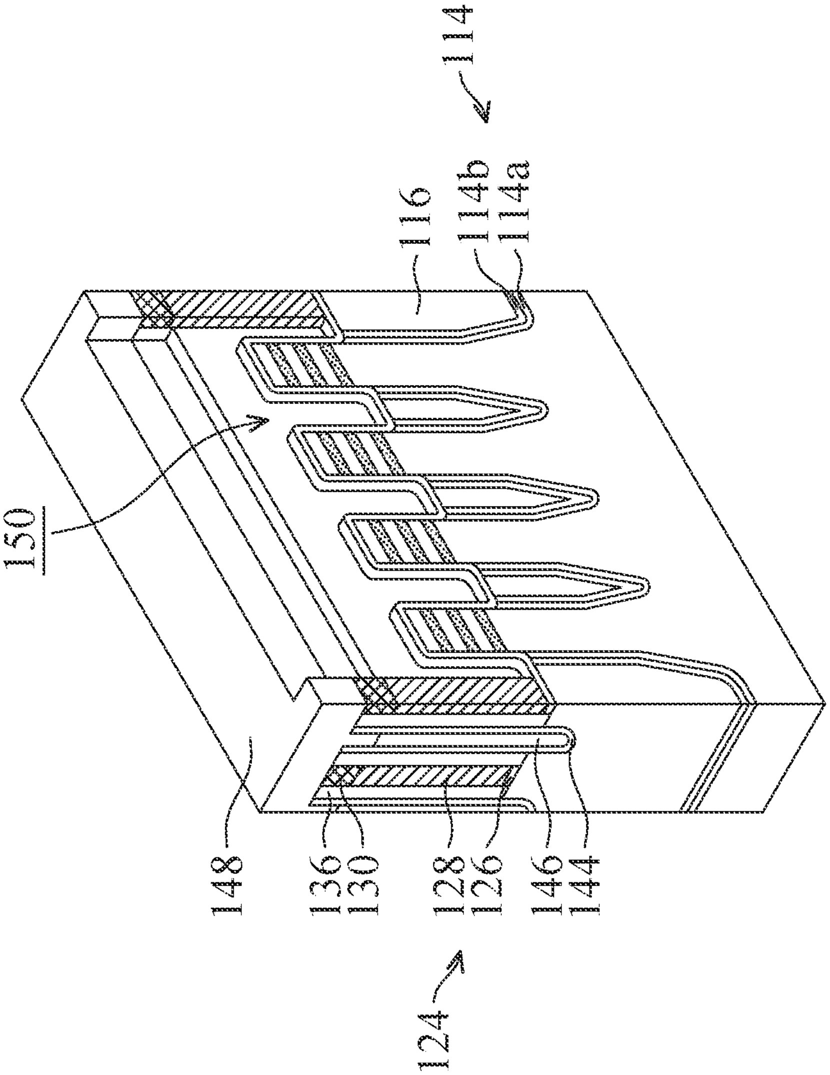
Figures 1, 1F:
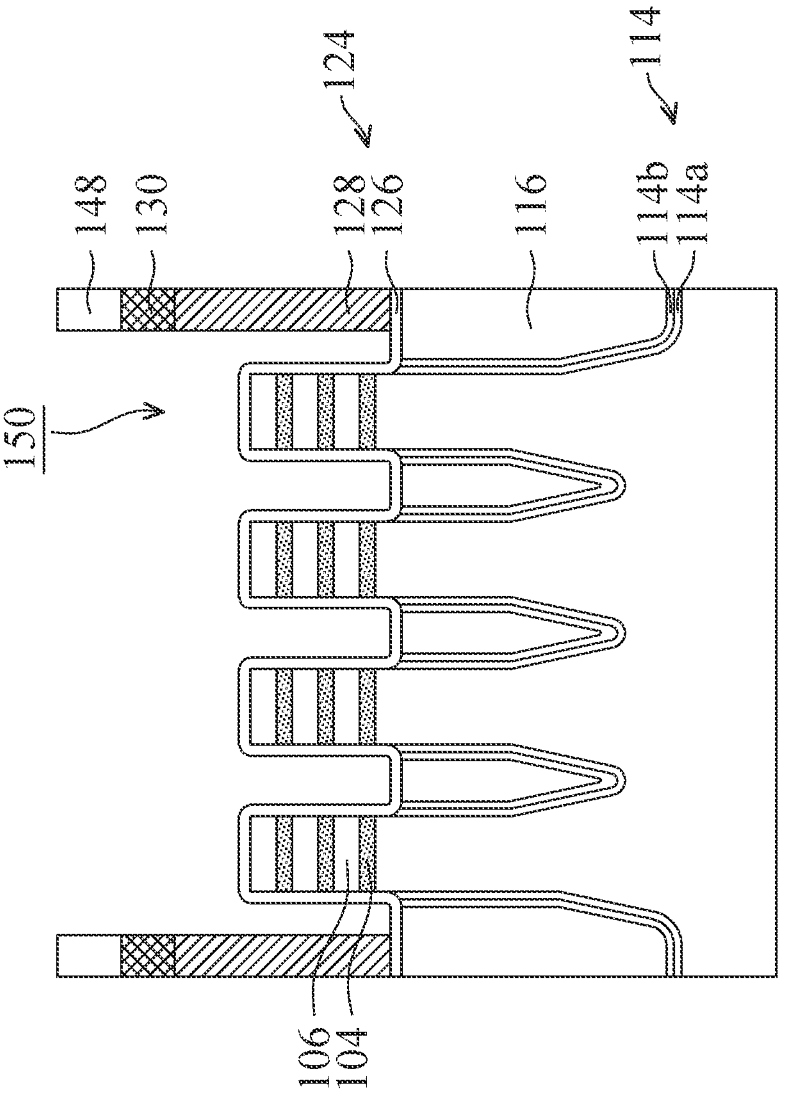
Figures 1, 1F, 2:
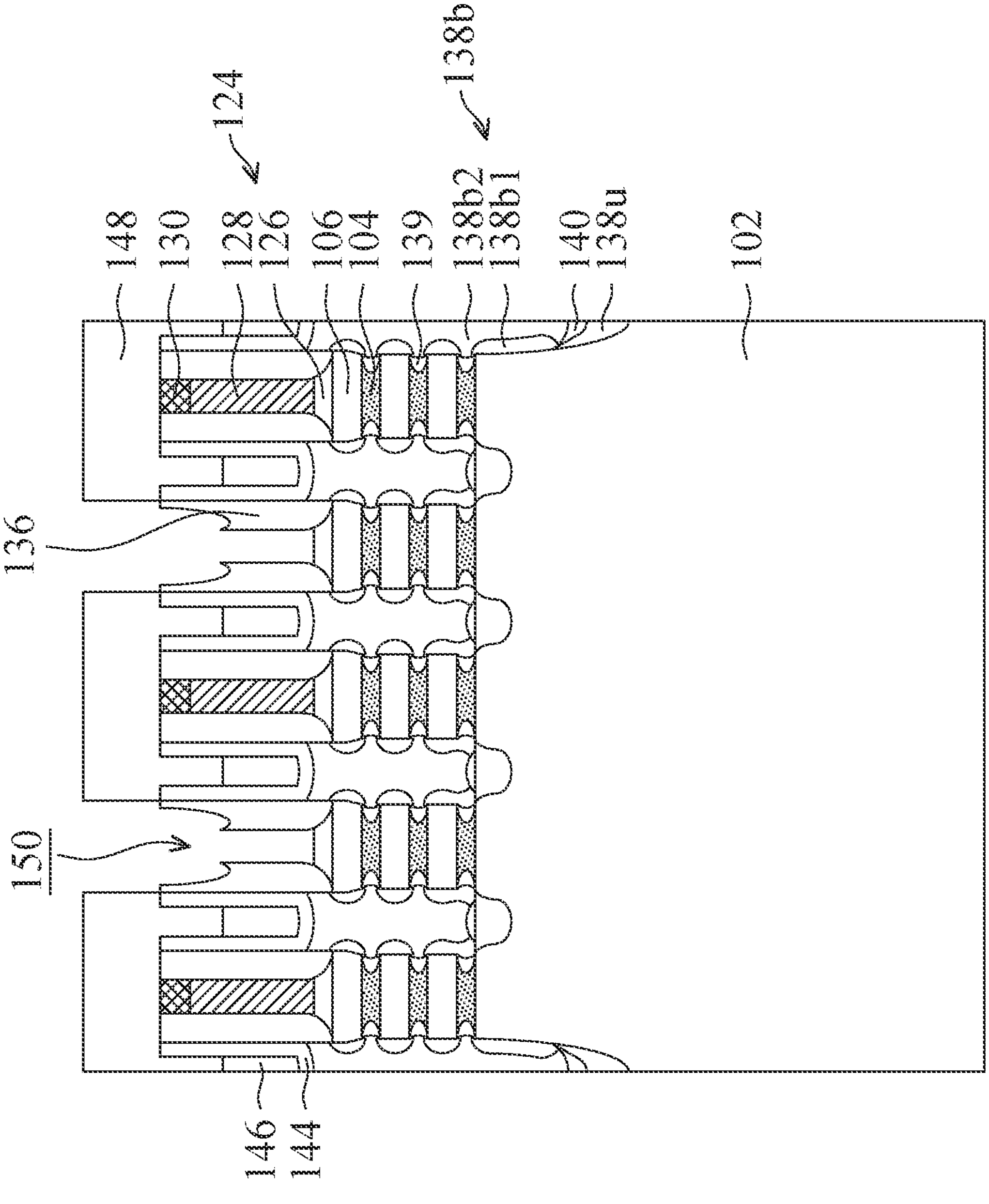

The second source/drain epitaxial structure 138*b* includes a first portion 138*b*1 and a second portion 138*b*2, as shown in FIG. 1F-2 in accordance with some embodiments. The first portion 138*b*1 may be formed over the sidewalls of the second semiconductor material layers 106 and the substrate 102, and the second portion 138*b*2 may be filled over the first portion 138*b*1 in the source/drain opening The first portion 138*b*1 may be made of dielectric material such as silicon nitride, silicon oxide, silicon oxynitride (SiON), other applicable materials, or a combination thereof. The first portion 138*b*1 also may be made of un-doped or lower doped Si or SiP. The second portion 138*b*2 may be doped SiP. In some embodiments, the dopant concentration of the second portion 138*b*2 is higher than the dopant concentration of the first portion 138*b*1. Therefore, dopant out-diffusing issue may be prevented.

Next, an etch stop layer 144 may be formed over the source/drain epitaxial structures 138*a* and 138*b*, as shown in FIG. 1E in accordance with some embodiments. More specifically, the etch stop layer 144 may cover the sidewalls of the gate spacer layers 136, the top surface of the second source/drain epitaxial structure **138*b*, and the top surface of the isolation layer 140 over the first source/drain epitaxial structure 138*a*. The etch stop layer 144 may be made of a dielectric material such as silicon nitride, silicon oxide, silicon oxynitride (SiON), other applicable materials, or a combination thereof. The etch stop layer 144** may be formed by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

After the etch stop layer 144 is formed, an inter-layer dielectric (ILD) structure 146 is formed over the etch stop layer 144 and the source/drain epitaxial structures **138*a* and 138*b*, as shown in FIG. 1E in accordance with some embodiments. In some embodiments, the ILD structure 146 surrounds the source/drain epitaxial structures 138*a* and 138*b***.

The ILD structure 146 may include multilayers made of multiple dielectric materials, such as silicon oxide ($SiO_x$, where x may be a positive integer), silicon oxycarbide ($SiCO_y$, where y may be a positive integer), silicon oxycarbonitride ($SiNCO_z$, where z may be a positive integer), silicon nitride, silicon oxynitride, phosphosilicate glass (PSG), borophosphosilicate glass (BPSG), low-k dielectric material, or another applicable dielectric material. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD structure 146 may be formed by chemical vapor deposition (CVD), physical vapor deposition (PVD), atomic layer deposition (ALD), spin-on coating, or another applicable process.

Afterwards, a planarizing process or an etch-back process may be performed on the ILD structure 146 until the top surface of the dummy gate structure 124 is exposed. After the planarizing process, the top surface of the dummy gate structure 124 may be substantially level with the top surfaces of the gate spacer layers 136 and the ILD structure 146. The planarizing process may include a grinding process, a chemical mechanical polishing (CMP) process, an etching process, other applicable processes, or a combination thereof.

Afterwards, the ILD structure 146 may be etched back, and a recess is formed over the ILD structure 146. The ILD structure 146 may be etched back by a dry etching process or a wet etching process.

Next, a hard mask layer 148 is blanketly formed over the dummy gate structure 124 and the ILD structure 146, as shown in FIG. 1F in accordance with some embodiments. The hard mask layer 148 may fill the recess over the ILD structure 146. The hard mask layer 148 may be made of silicon nitride, which may be formed by CVD, such as LPCVD or plasma-enhanced CVD (PECVD).

Afterwards, an opening 150 is formed in a portion of the dummy gate structure 124, and the fin structures 112 are exposed from the opening 150, as shown in FIGS. 1F, 1F-1 and 1F-2 in accordance with some embodiments. In some embodiments, the gate spacer layers 136 are exposed in the opening 150.

Figure 1G:
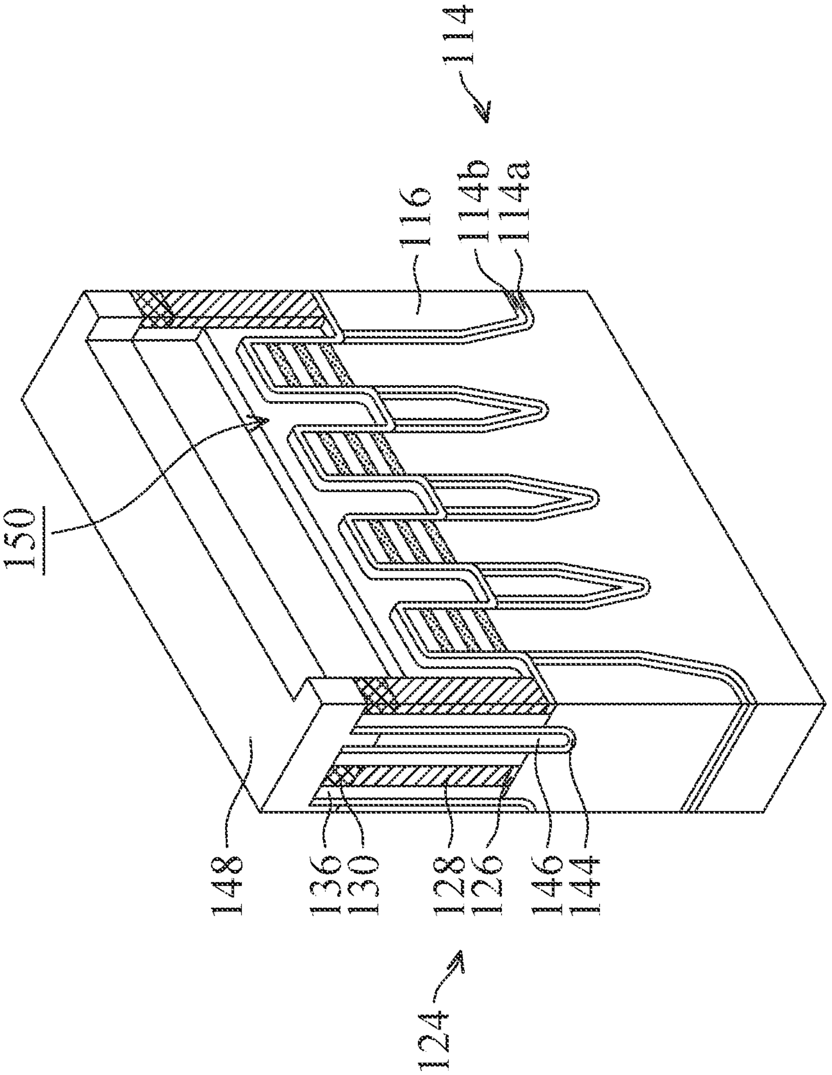
Figures 1, 1G:
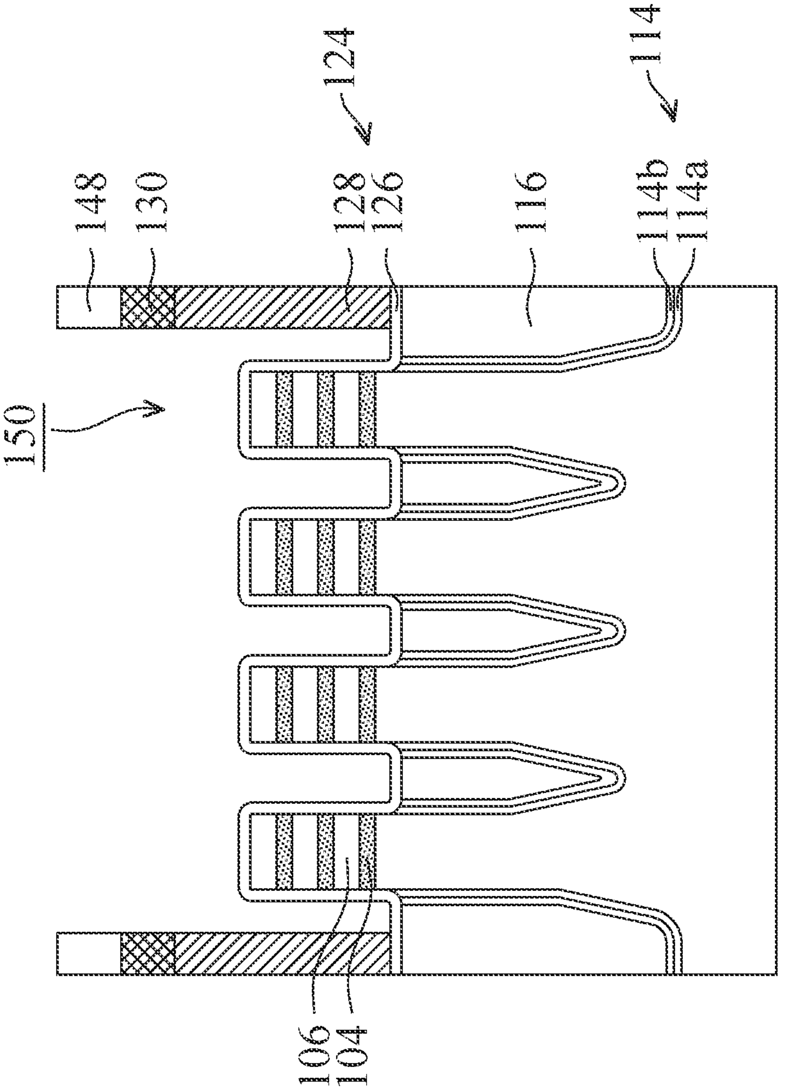
Figures 1, 1G, 2:
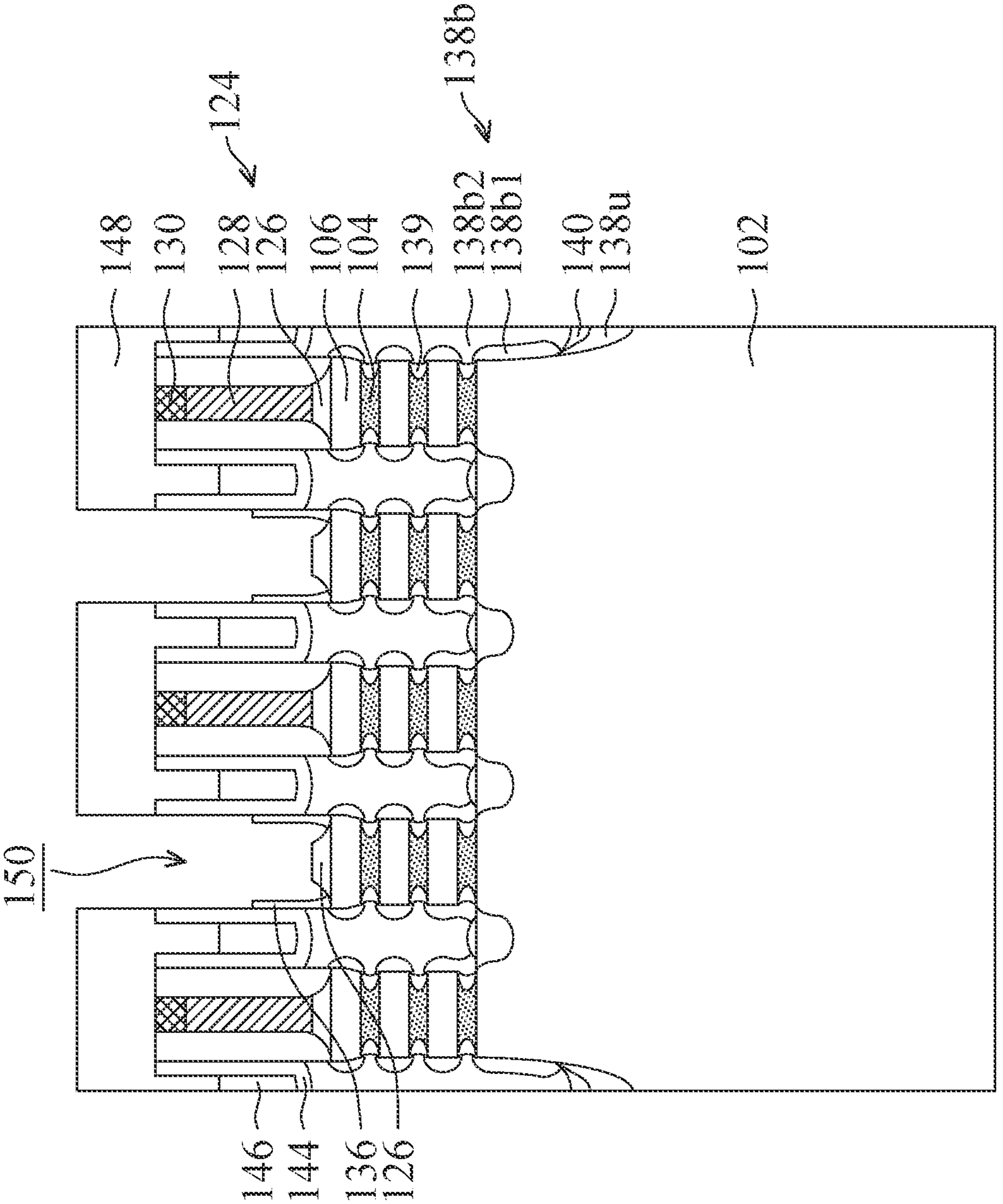

Next, the gate spacer layers 136 are further trimmed from the opening 150, as shown in FIGS. 1G, 1G-1 and 1G-2 in accordance with some embodiments. In some embodiments, the bottom portions of the gate spacer layers 136 remain after the trimming process. The gate spacer layers 136 may be trimmed by a dry etching process or a wet etching process.

Figure 1H:
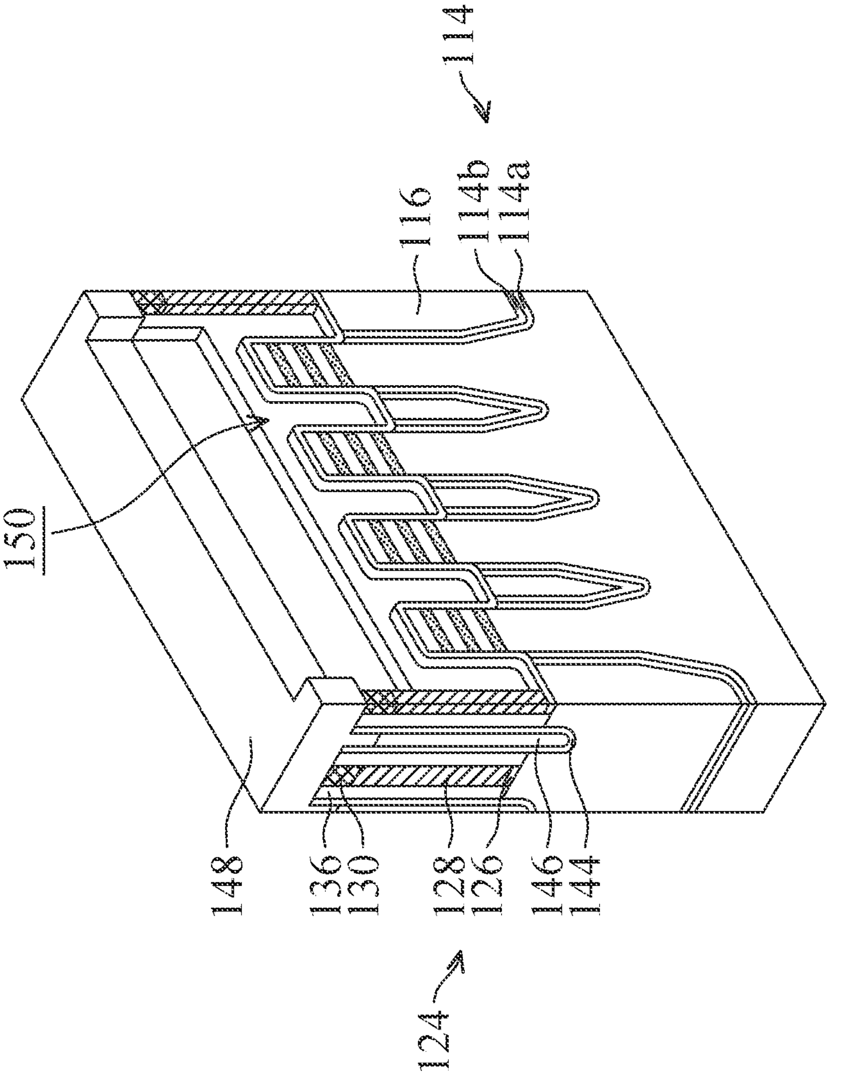
Figures 1, 1H:
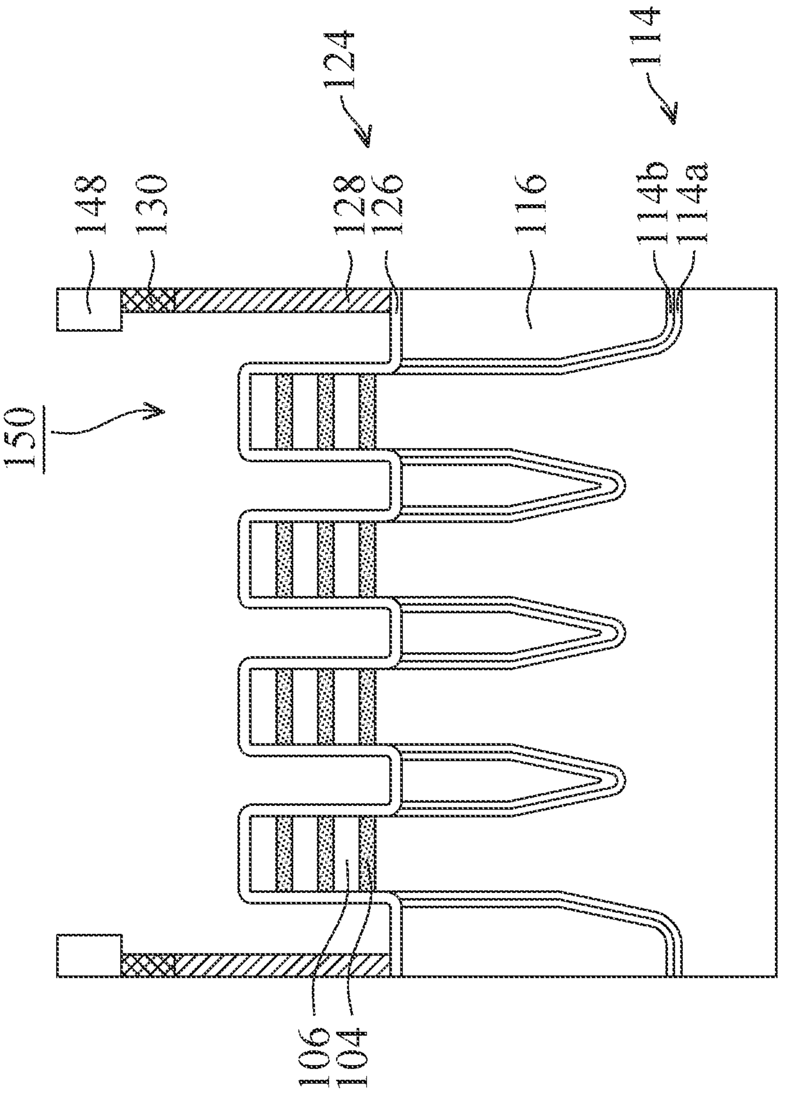
Figures 1, 1H, 2:
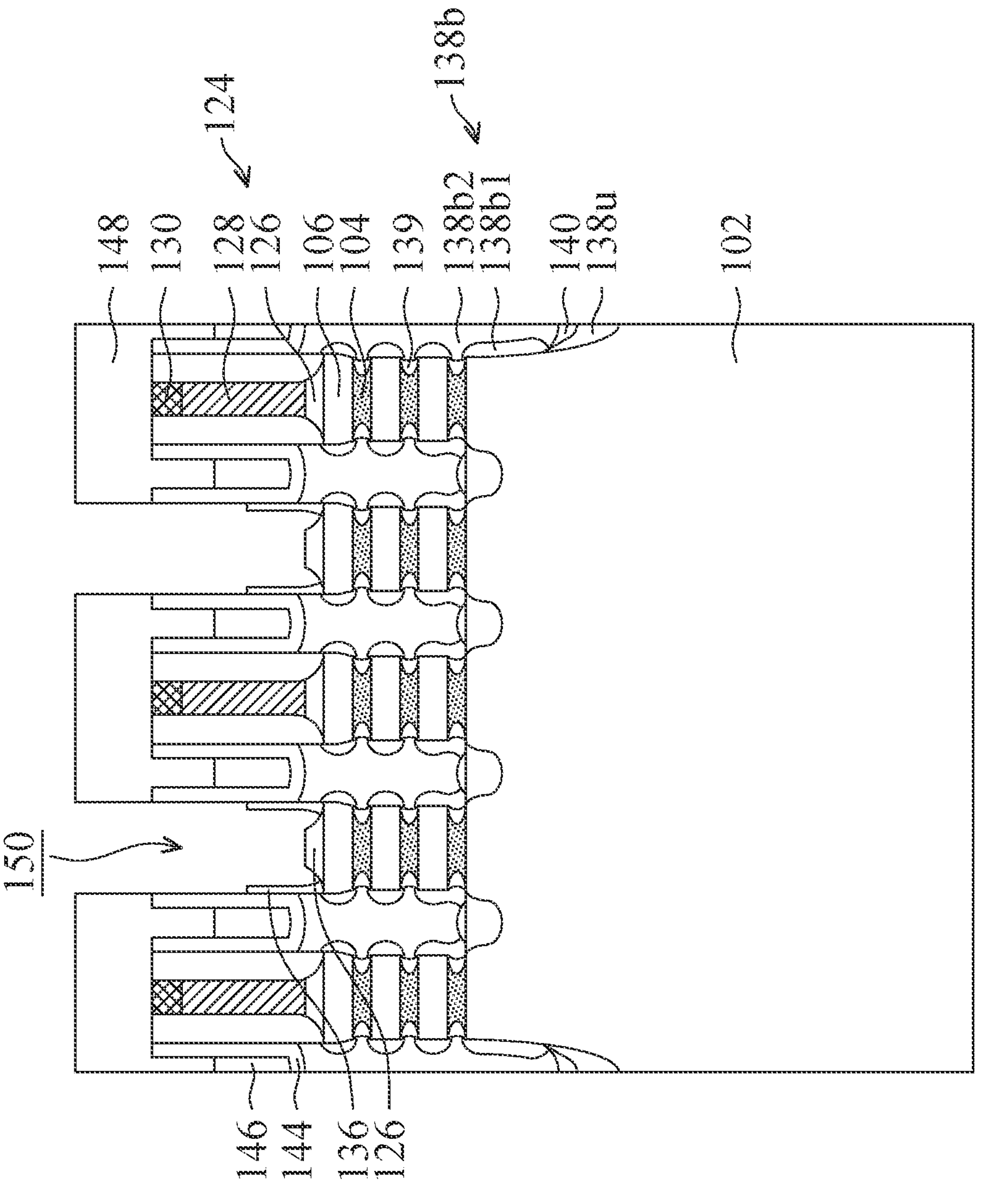

Next, the dummy gate structure 124 is laterally etched in the direction which the dummy gate structure 124 extends, as shown in FIGS. 1H, 1H-1 and 1H-2 in accordance with some embodiments. The opening 150 may be enlarged under the hard mask layer 148. In some embodiments, the hard mask layer 148 extends from the sidewalls of the dummy gate structure 124. The hard mask layer 148 may be laterally etched by a dry etching process or a wet etching process. In some embodiments, the dummy gate structure 124 is laterally etched by about 3 nm to about 4 nm. If the dummy gate 124 is laterally etched too much, the process window of the following etching processes may be too limited. If the dummy gate 124 is laterally etched too less, the subsequently formed isolation gate structure may be damaged when forming the gate structure.

Figure 1I:
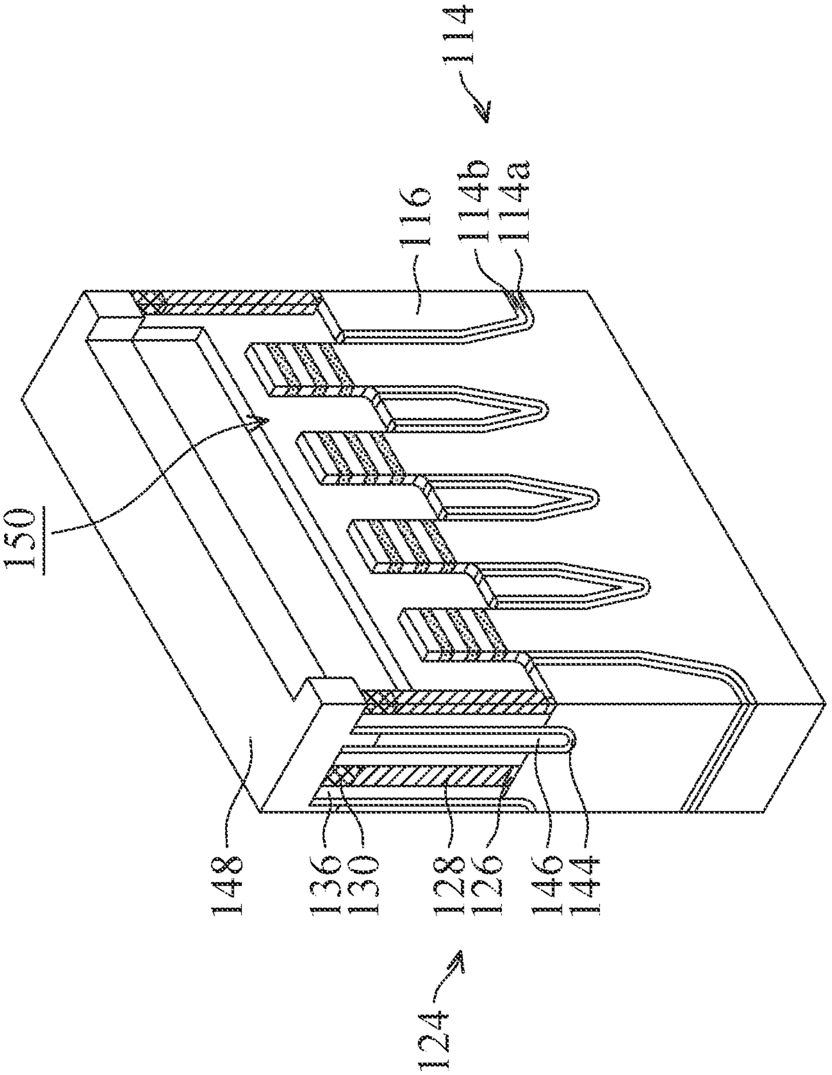
Figures 1, 1I:
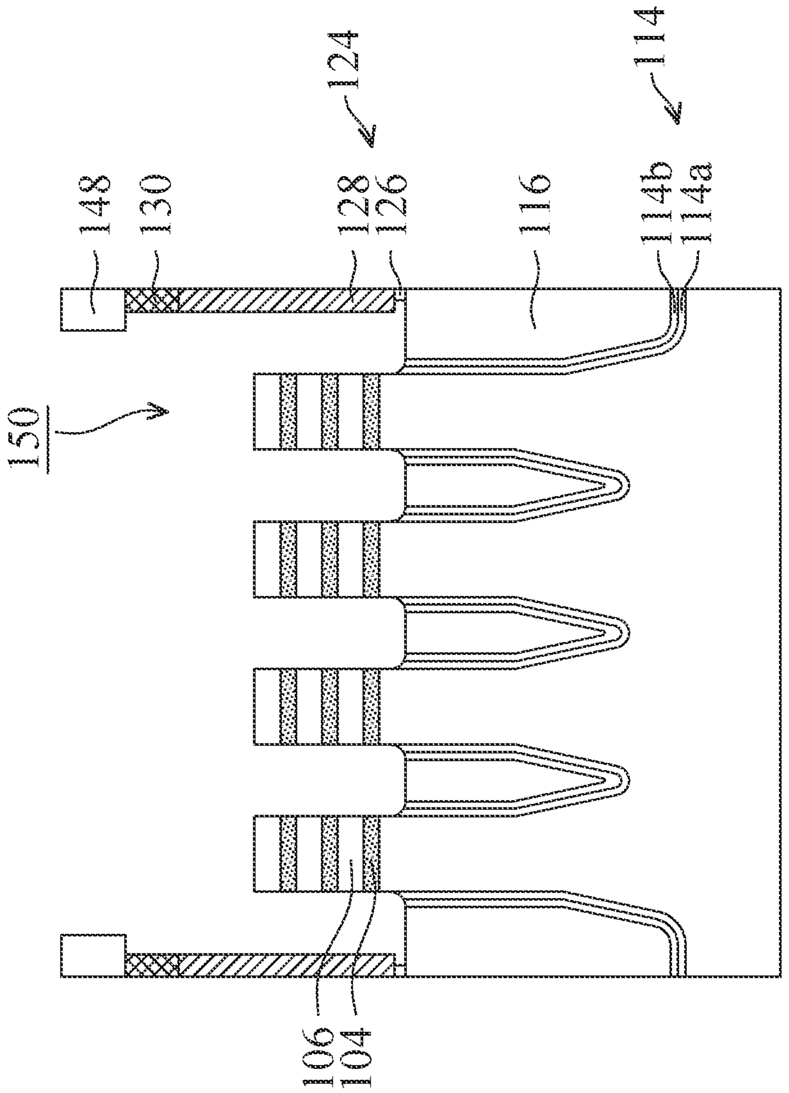
Figures 1, 1I, 2:
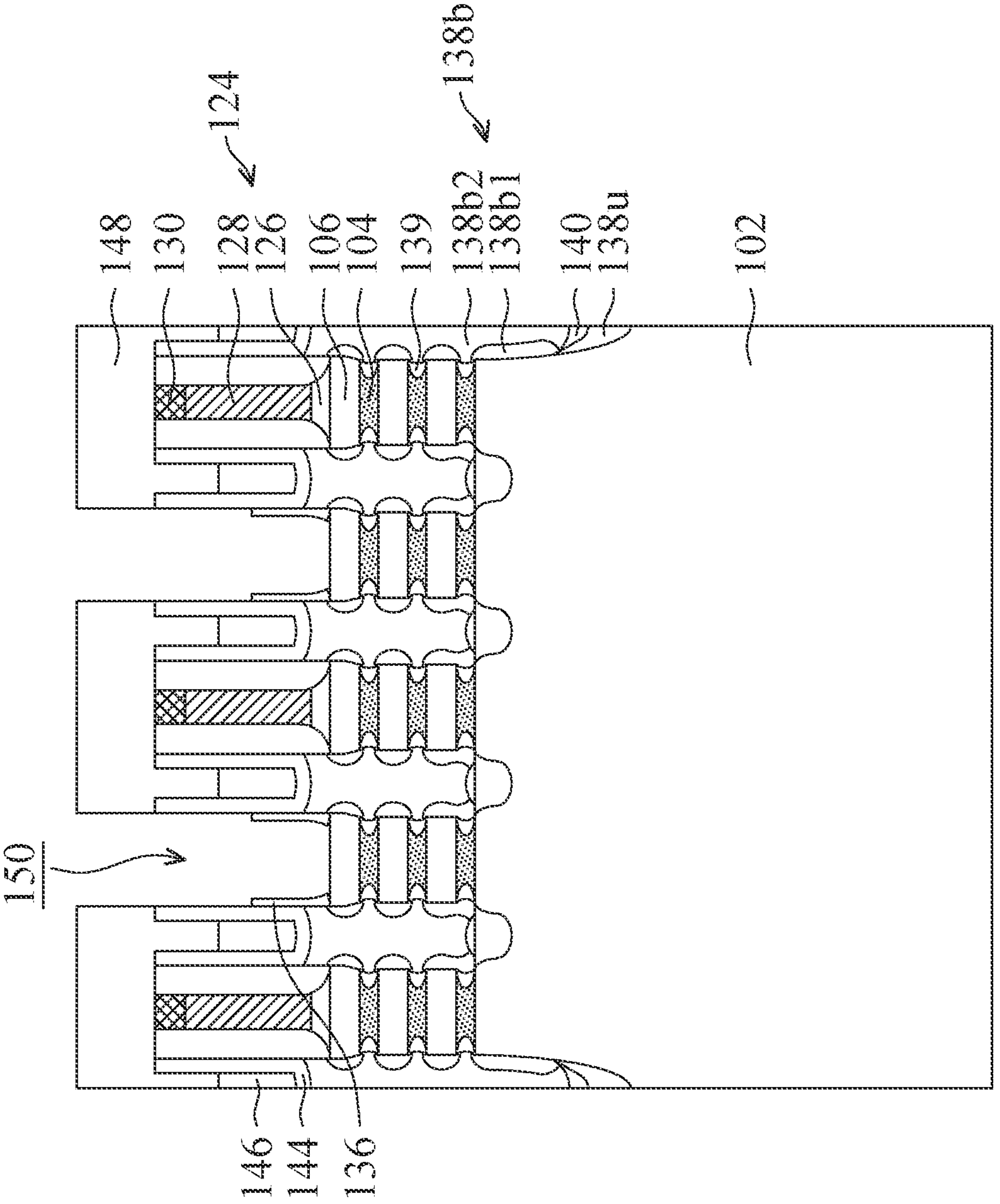

Afterwards, the dummy gate dielectric layer 126 exposed in the opening 150 is removed, as shown in FIGS. 1I, 1I-1 and 1I-2 in accordance with some embodiments. In some embodiments, the dummy gate electrode layer 128 extends over the sidewalls of the dummy gate dielectric layer 126. The dummy gate dielectric layer 126 may be removed by a dry etching process or a wet etching process.

Figure 1J:
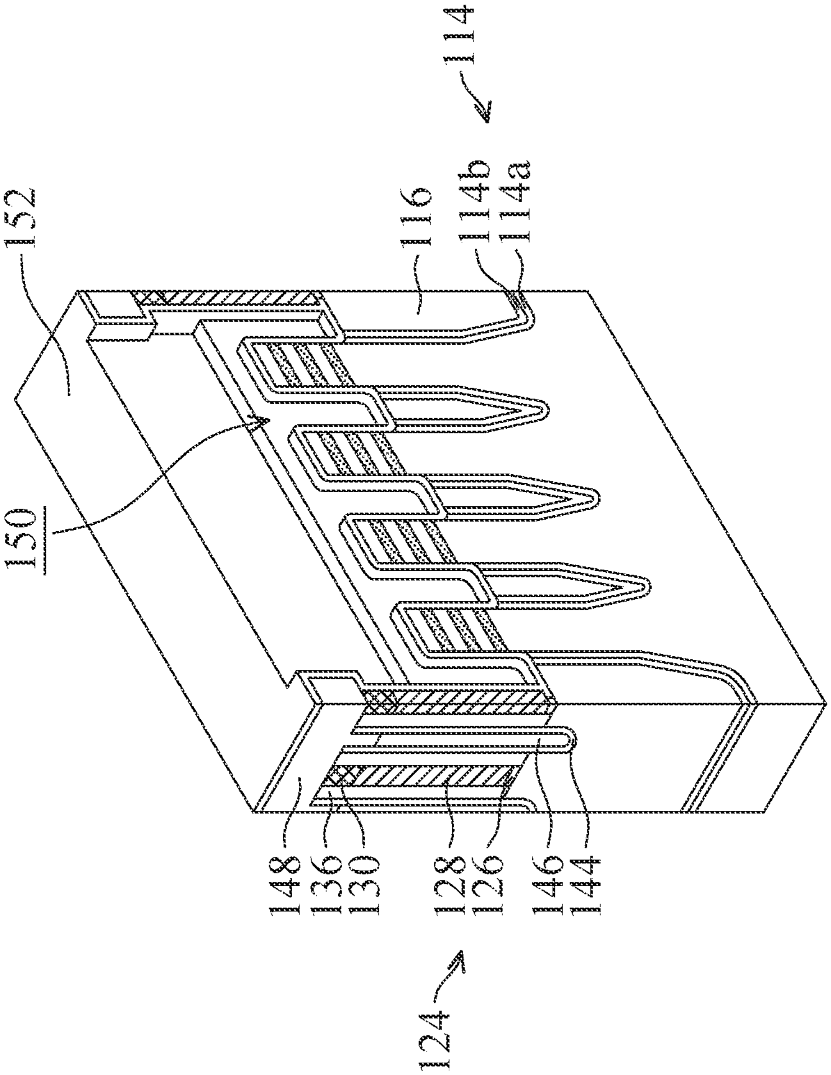
Figures 1, 1J:
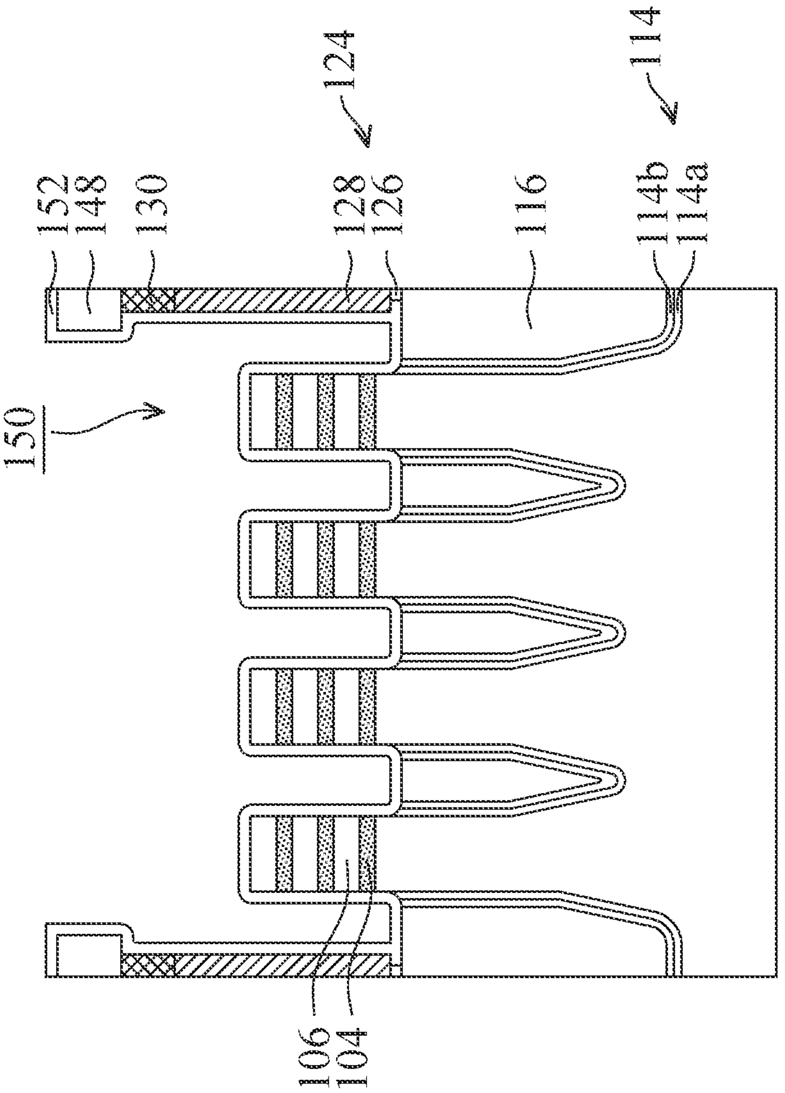
Figures 1, 1J, 2:
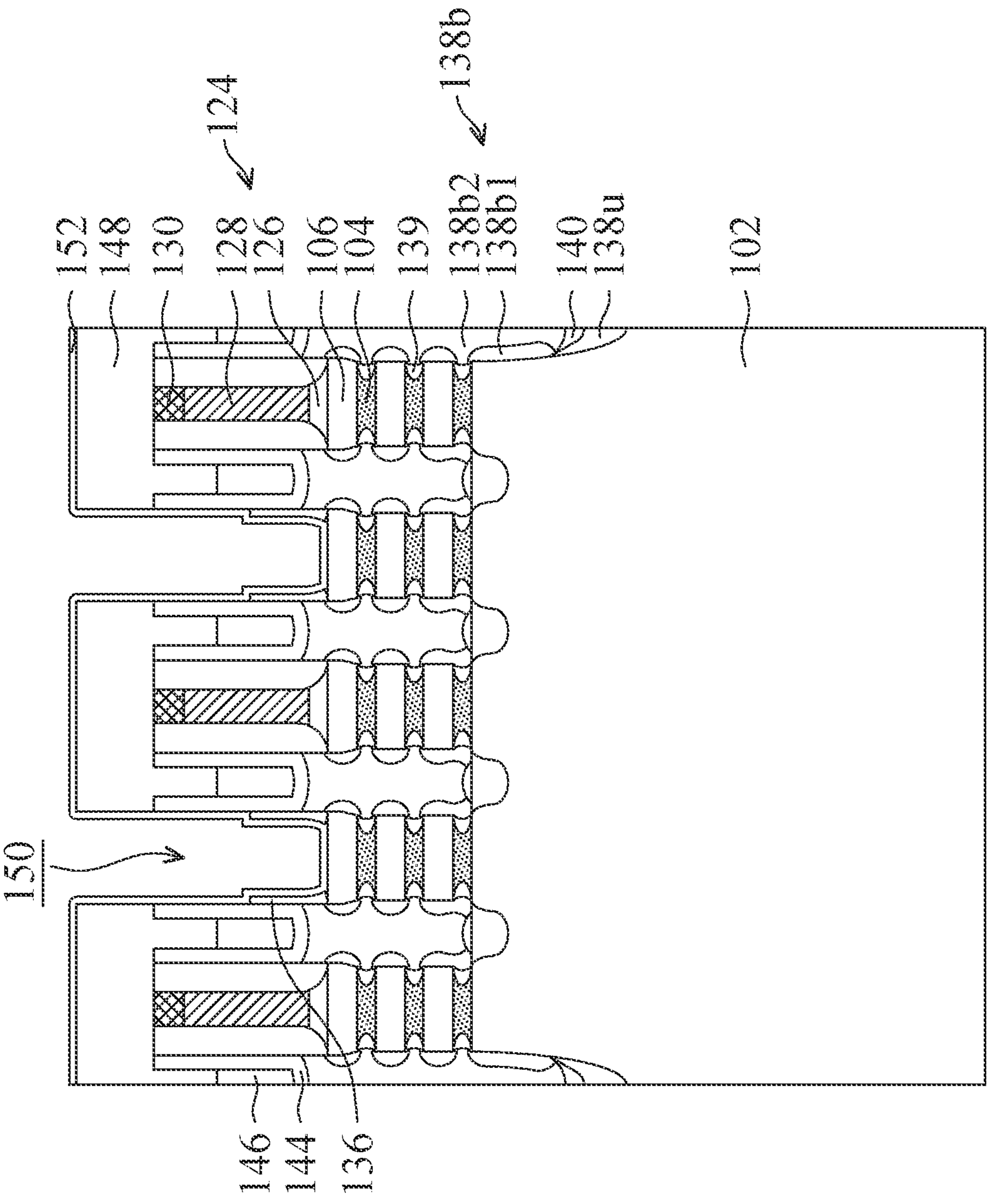

Next, a shell material 152 is conformally deposited in the opening 150 and over the hard mask layer 148, as shown in FIGS. 1J, 1J-1 and 1J-2 in accordance with some embodiments. The shell material 152 may be made of SiCON, HfO, other suitable material, or a combination thereof. The shell material 152 may be deposited by using CVD, ALD, other applicable methods, or a combination thereof.

Figure 1K:
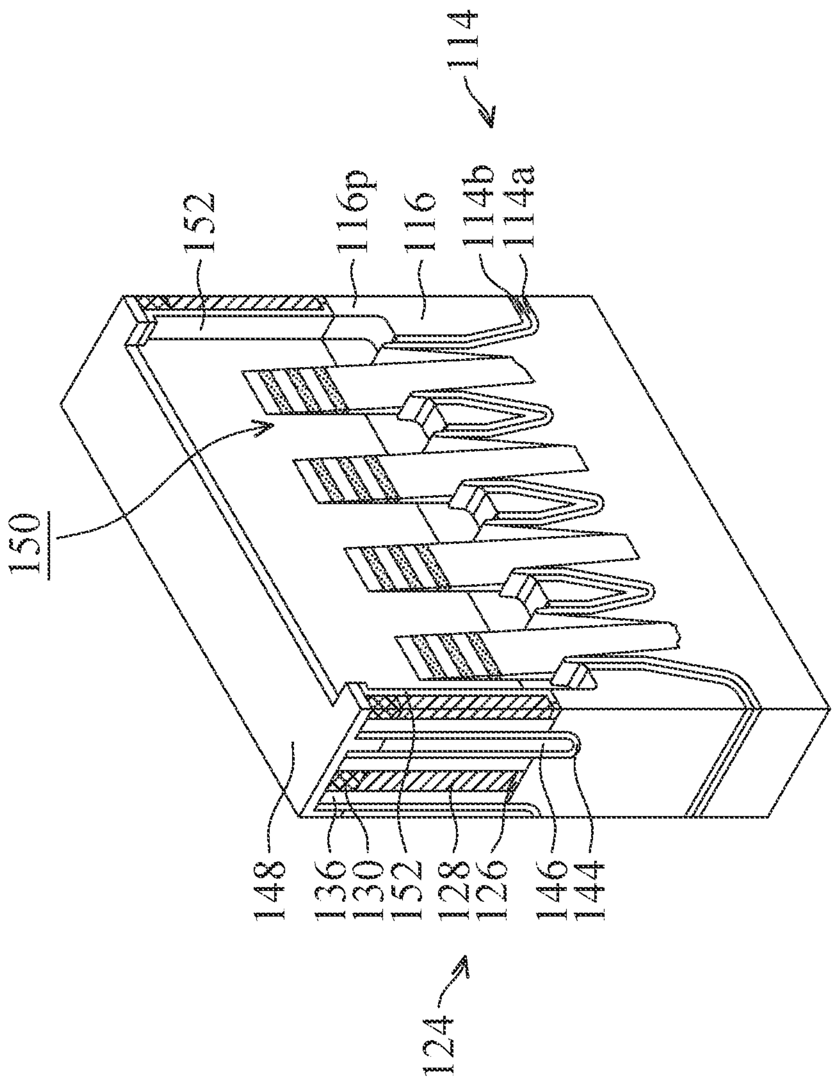
Figures 1, 1K:
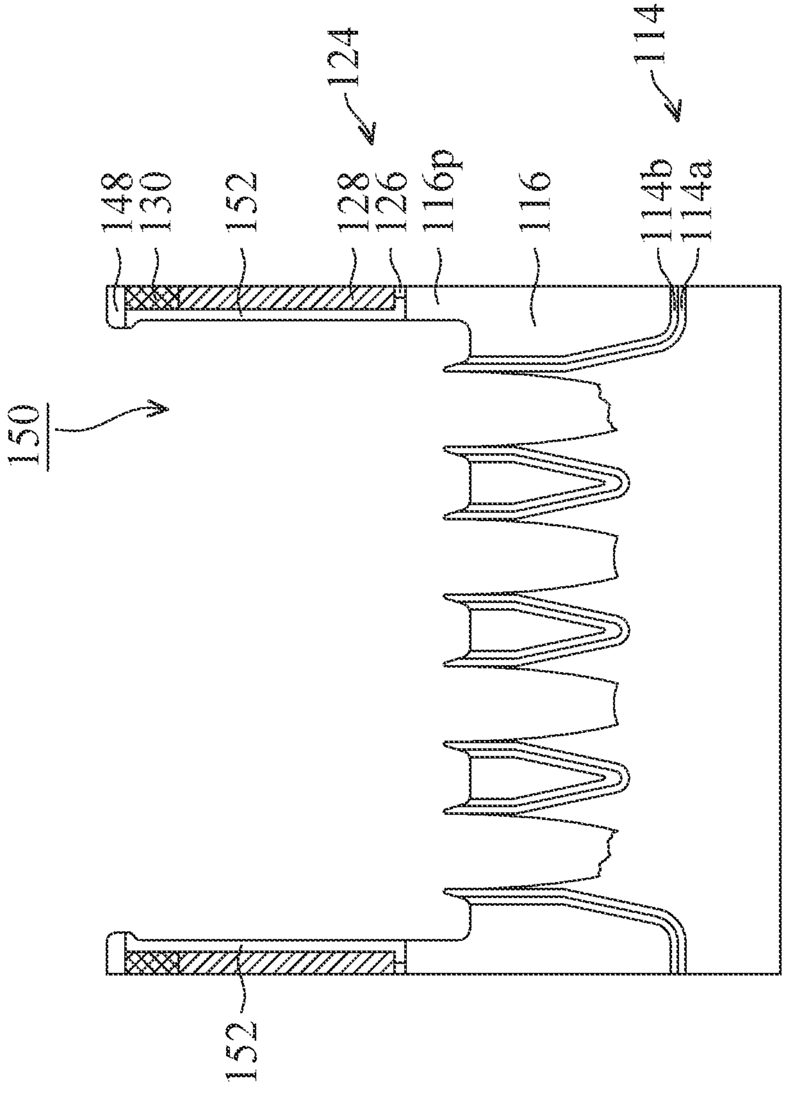
Figures 1, 1K, 2:
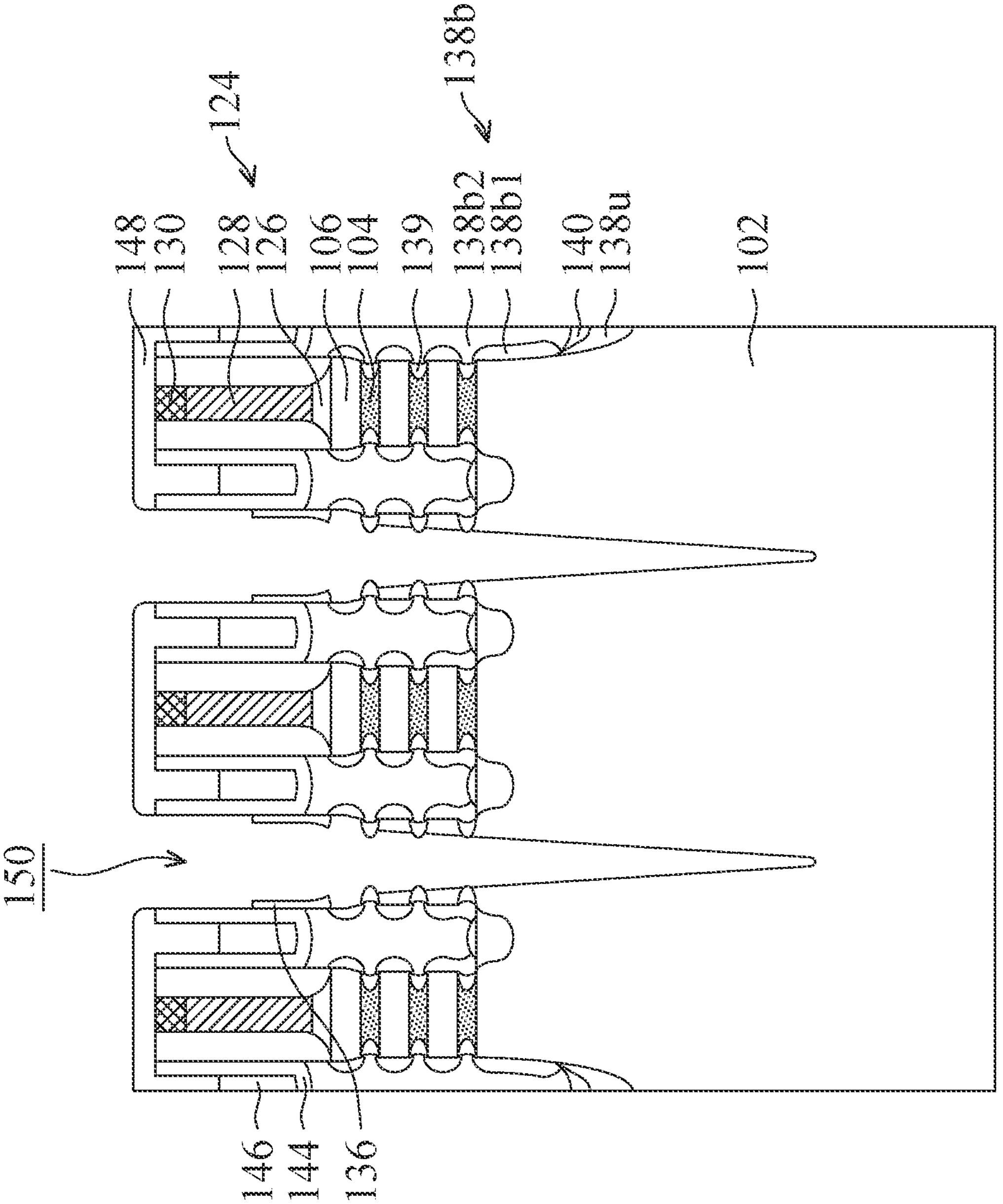

Afterwards, the shell material 152 and the fin structures 112 exposed in the opening 150 are etched back, as shown in FIGS. 1K, 1K-1 and 1K-2 in accordance with some embodiments. The opening 150 may be enlarged in the direction of which the fin structure 112 extends. In some embodiments, a shell structure 152 is formed over the sidewalls of the dummy gate structure 124 under the hard mask layer 148. In some embodiments, the shell structure 152 is formed over the isolation structure 116. The shell material 152 and the fin structures 112 may be etched by a dry etching process or a wet etching process. In some embodiments, the shell material 152 and the fin structures 112 are etched by a dry etching process.

The isolation structure 116 may be recessed during the etching process. In some embodiments, the isolation structure 116 has a protruding portion **116*p* in direct contact with the shell structure 152**.

In some embodiments, the shell structure 152 has a thickness of about 2 nm to about 6 nm. If the shell structure 152 is too thin, the subsequently formed isolation gate structure may be consumed while subsequently forming the gate structure. If the shell structure 152 is too thick, the process window of the following etching processes may be too limited.

Figure 1L:
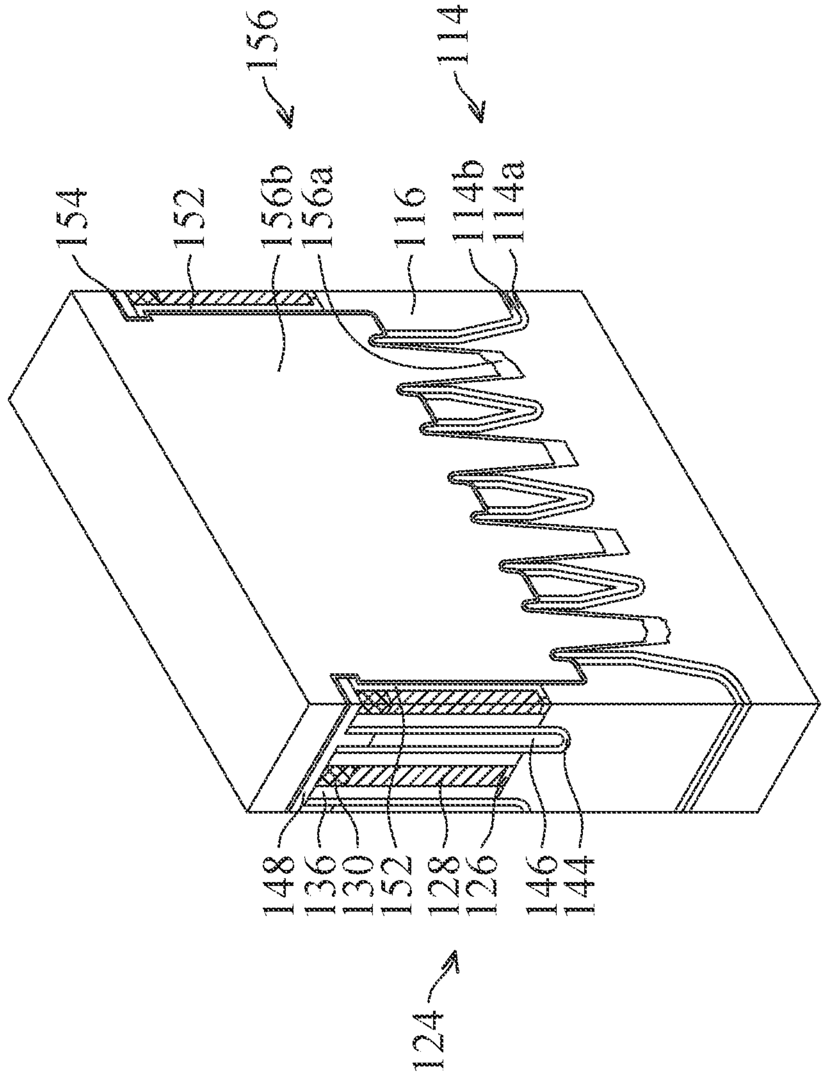
Figures 1, 1L:
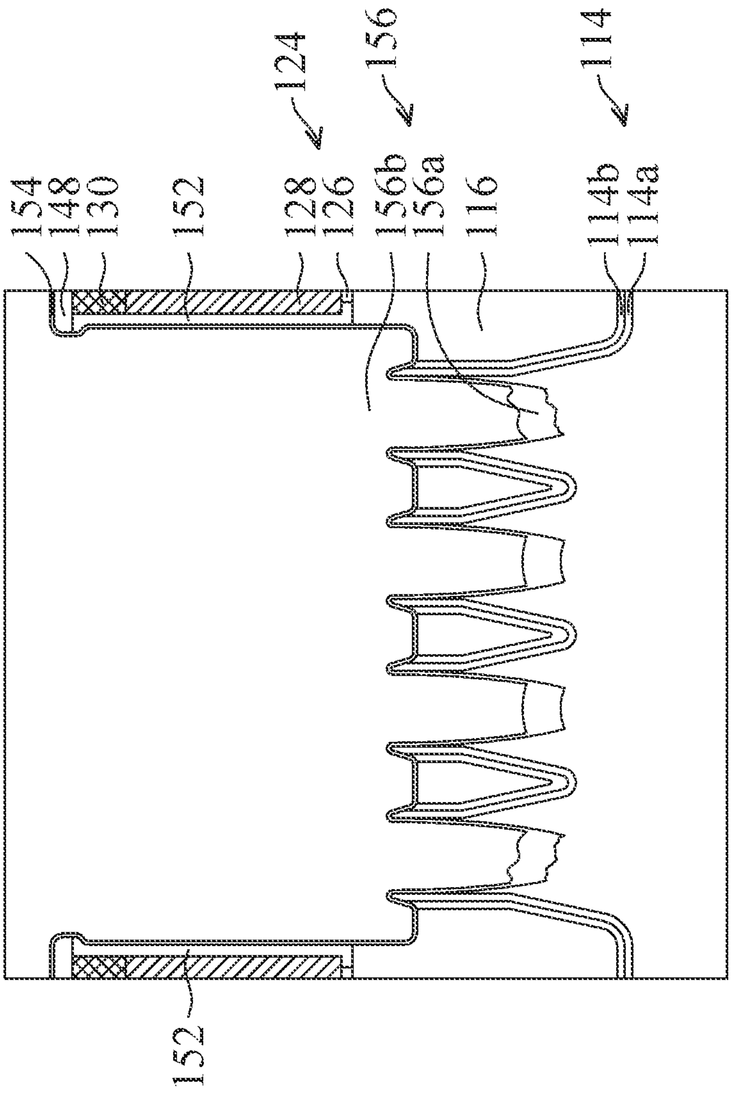
Figures 1, 1L, 2:
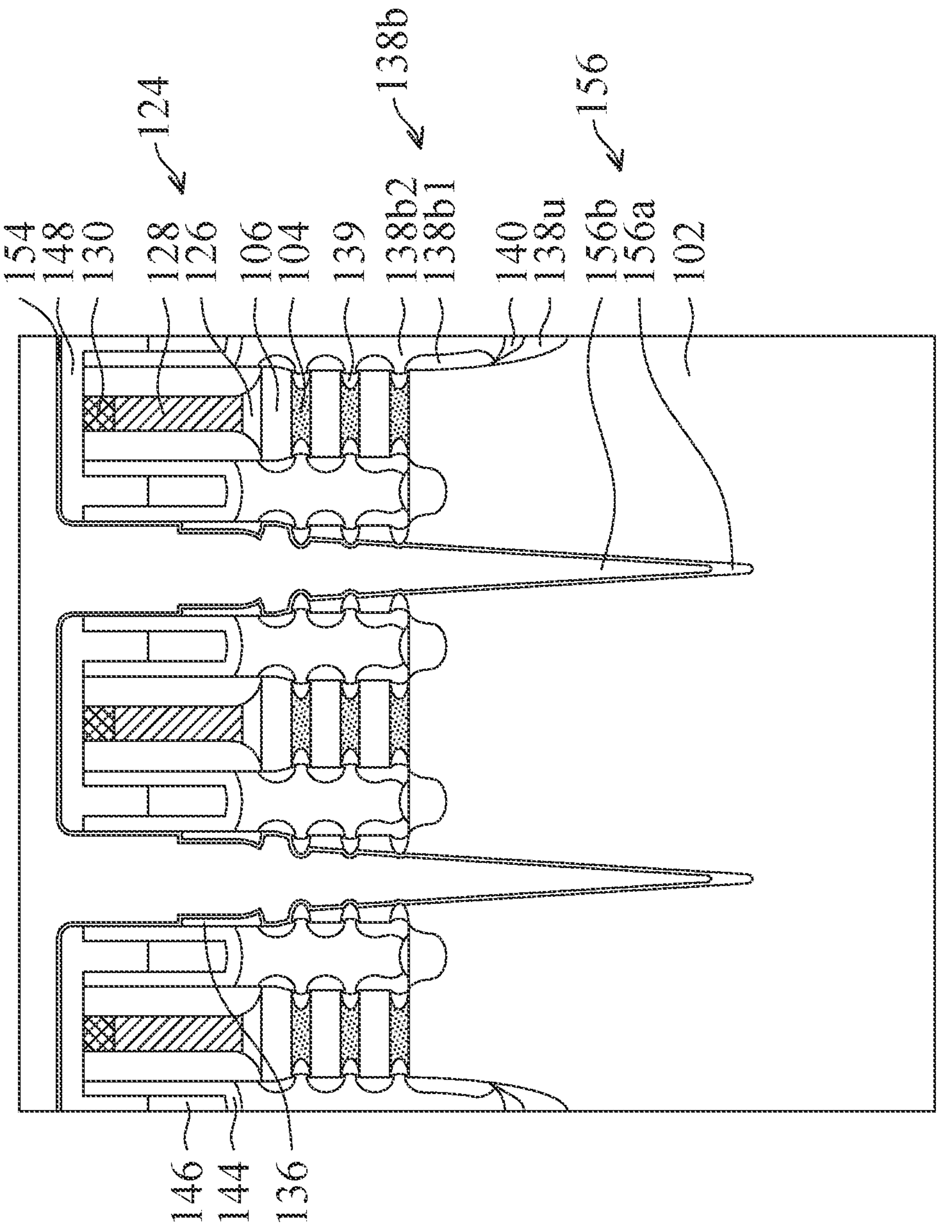

Next, a shell liner layer 154 is conformally formed in the opening 150, as shown in FIGS. 1L, 1L-1 and 1L-2 in accordance with some embodiments. The shell liner layer 154 may prevent leakage current. The shell liner layer 154 may include oxides, nitrides, other suitable materials, or a combination thereof. In some embodiments, the shell liner layer 154 is a multi-layer structure. In some embodiments, the shell liner layer 154 may be formed by depositing an oxide layer first, and depositing a nitride layer later. The thickness of the shell liner layer 154 may be in a range of about 1 nm to about 3 nm. The shell liner layer 154 may be deposited by using CVD, ALD, other applicable methods, or a combination thereof.

Next, an isolation gate structure 156 is formed over the shell liner layer 154 in the opening 150, as shown in FIGS. 1L, IL-1 and 1L-2 in accordance with some embodiments. In some embodiments, the shell structure 152 is formed over the sidewall of the isolation gate structure 156. In some embodiments, since the opening 150 is enlarged when etching back the shell material 152, the isolation gate structure 156 is wider than the shell structure 152. In some embodiments, the isolation gate structure 156 protrudes in the substrate 102 beside the isolation structure 116.

In some embodiments, the isolation gate structure 156 is a multi-layer structure. The isolation gate structure 156 may include a first isolation gate structure layer 156*a* and a second isolation gate structure layer 156*b*. The isolation gate structure 156 may be formed by filling the material of the first isolation gate structure layer 156*a* in the opening 150, and etching back the material of the first isolation gate structure layer 156*a*, and then filling the material of the second isolation gate structure layer 156*b* over the material of the first isolation gate structure layer 156*a*. In some embodiments, the boundary between the first isolation gate structure layer 156*a* and the second isolation gate structure layer 156*b* is substantially parallel to the top surface of the isolation gate structure 156.

The isolation gate structure 156 may be made of SiO2, SiCO, SiO2:F, SiN, SiCN, SiCON, oxide, nitrogen, and carbon base content materials, other suitable materials, or a combination thereof. In some embodiments, the first isolation gate structure layer 156*a* is made of oxides, and the second isolation gate structure layer 156*b* is made of nitrides. The first isolation gate structure layer 156*a* and the second isolation gate structure layer 156*b* may be deposited by using CVD, ALD, other applicable methods, or a combination thereof.

Next, the first semiconductor material layers 104 may be removed and gaps may be formed between the second semiconductor material layers 106. More specifically, the second semiconductor material layers 106 exposed by the gaps between the nanostructures 106, and the nanostructures 106 are configured to function as channel regions 106 in the resulting semiconductor devices 10*a* in accordance with some embodiments.

The first semiconductor material layers 104 may be removed by performing one or more etching processes. The etching process may include a selective wet etching process, such as APM (e.g., ammonia hydroxide-hydrogen peroxide-water mixture) etching process. The wet etching process uses etchants such as ammonium hydroxide ($NH_4OH$), TMAH, ethylenediamine pyrocatechol (EDP), potassium hydroxide (KOH) solutions, or a combination thereof.

Figure 1M:
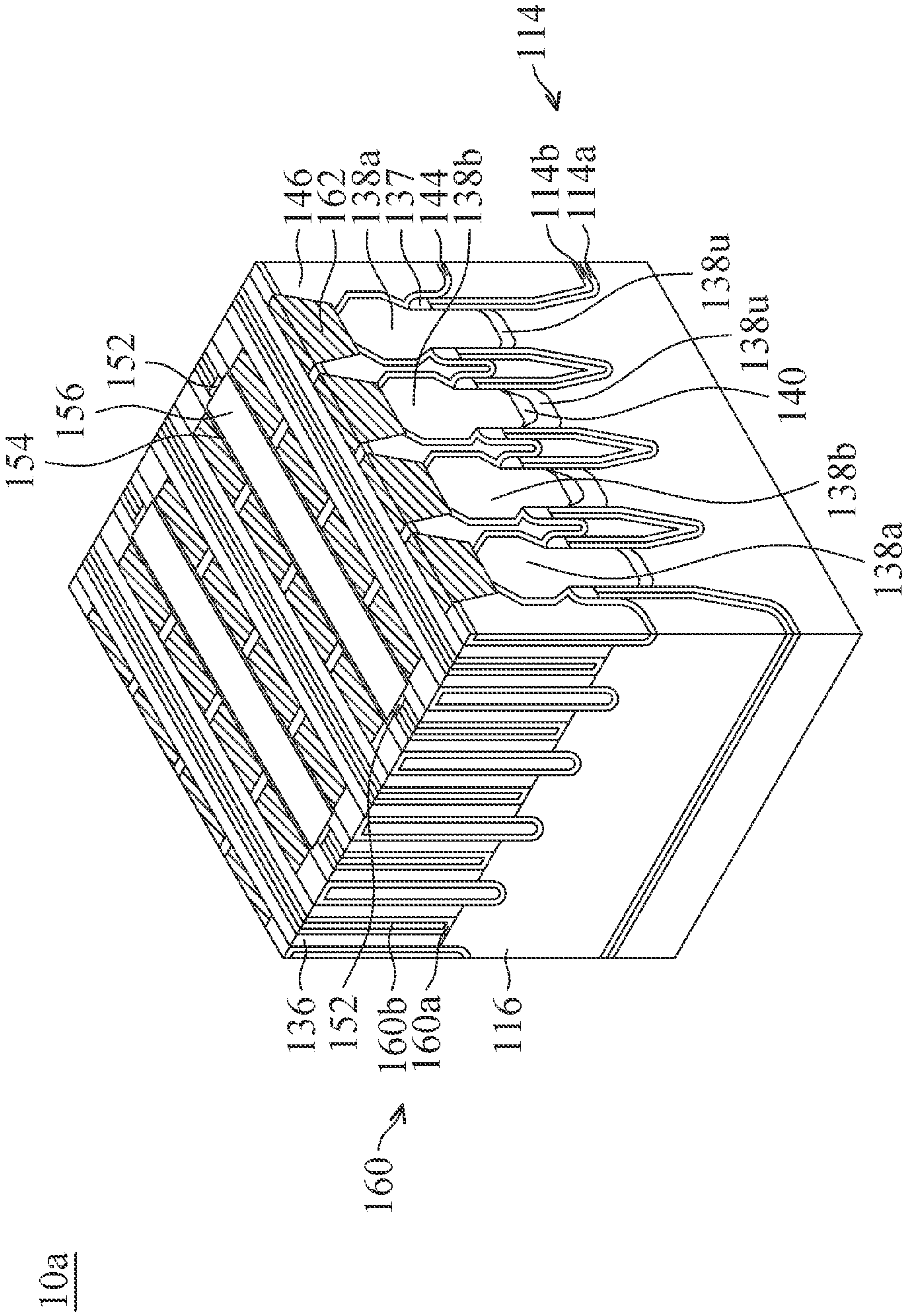
Figures 1, 1M:
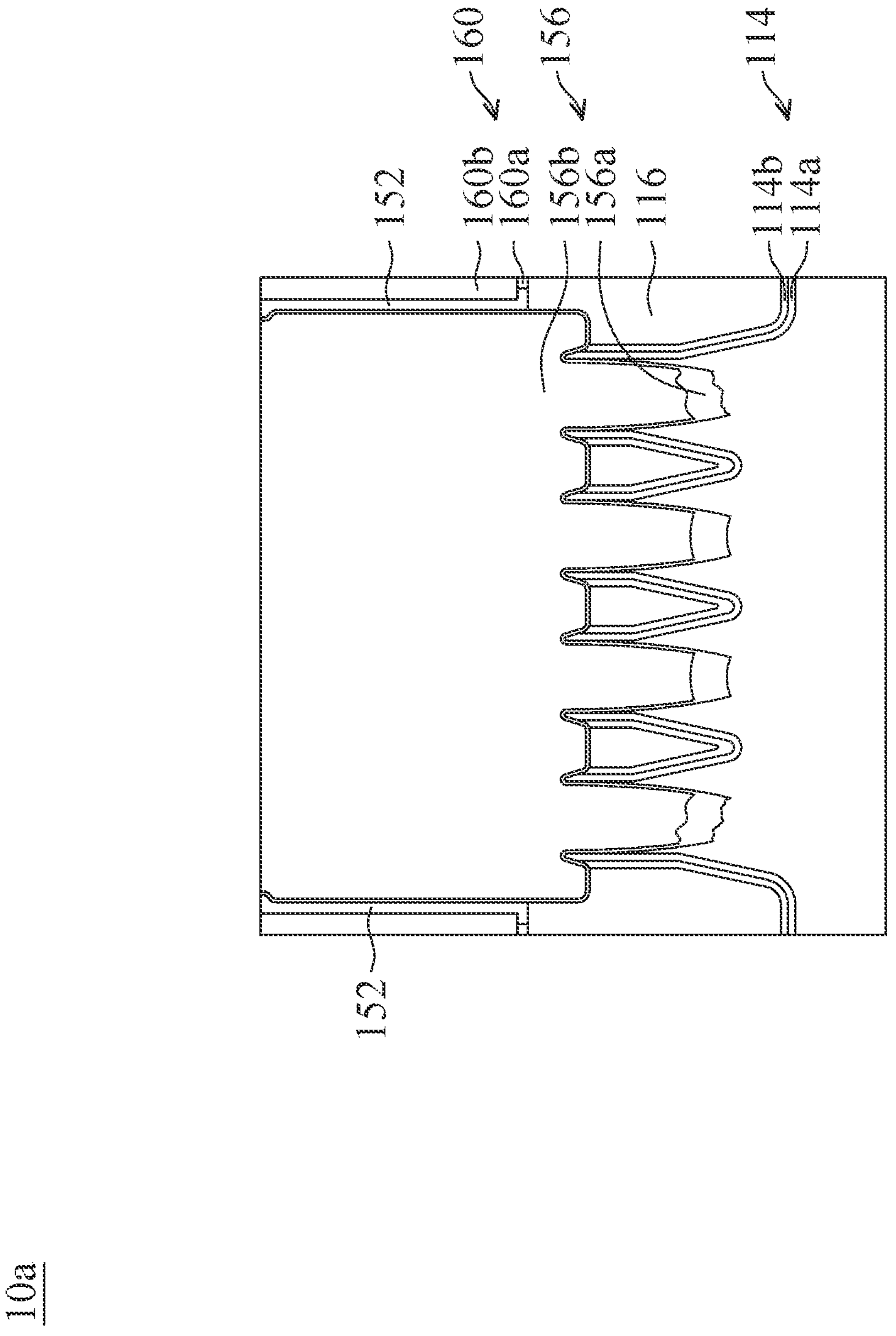
Figures 1, 1M, 2:
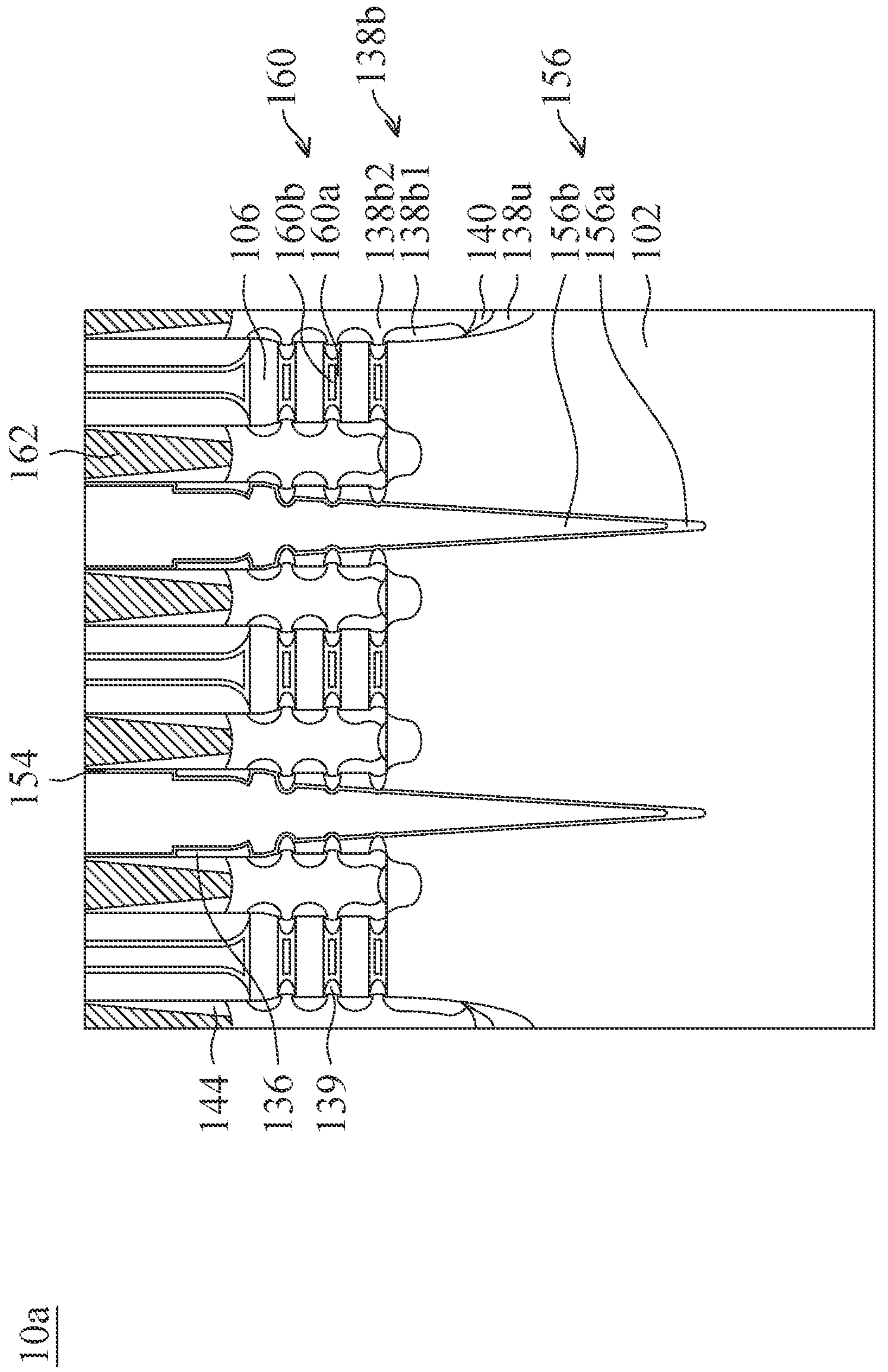
Figure 2:
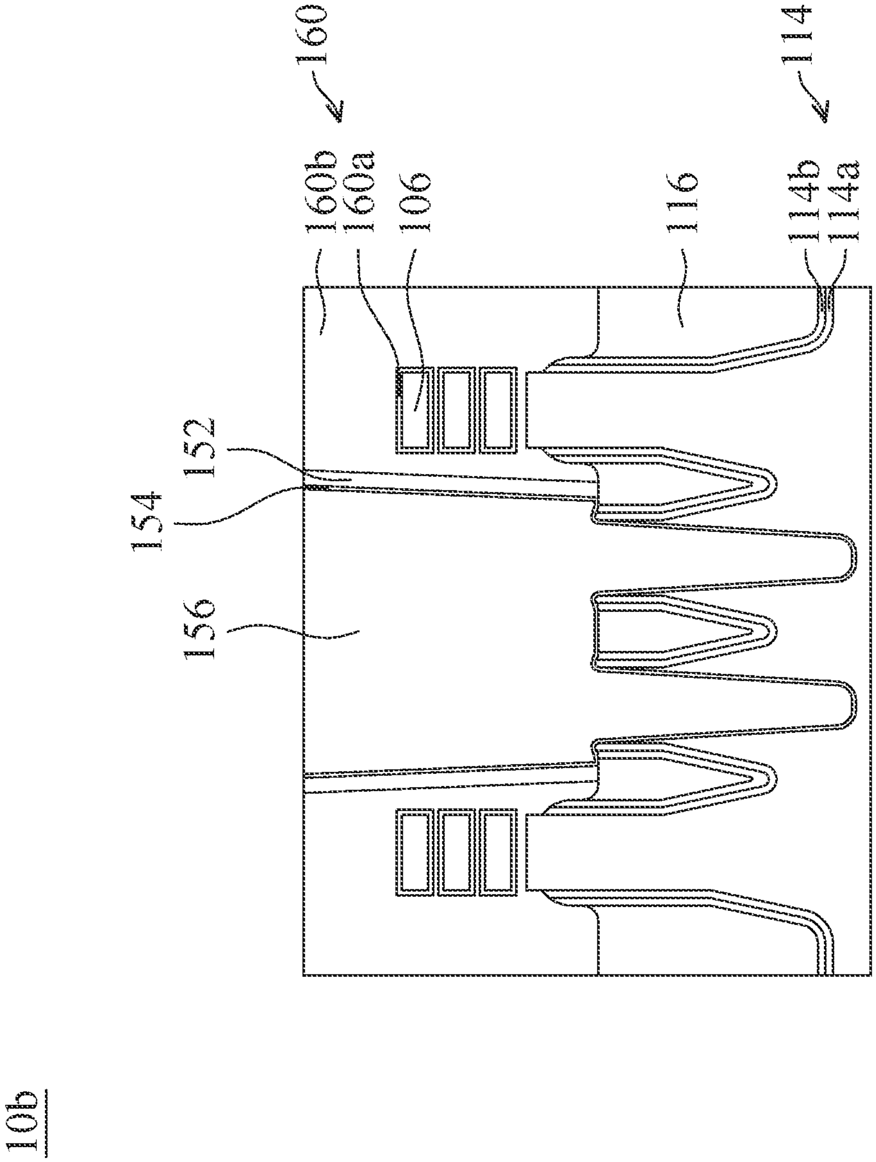

Next, gate structures 160 are formed surrounding the nanostructures 106 and over the nanostructures 106, as shown in FIGS. 1M, 1M-1 and 1M-2 in accordance with some embodiments. The gate structures 160 are formed surrounding the nanostructures 106 to form gate-all-around (GAA) transistor structures. Therefore, the gate control ability may be enhanced. In some embodiments, the shell structure 152 is in direct contact with the gate structures 160.

In some embodiments as shown in FIGS. 1M, 1M-1 and 1M-2, the gate structures 160 are multi-layered structures. Each of the gate structures 160 may include an interfacial layer, a gate dielectric layer 160*a*, a work function layer 160*b*, and a gate electrode layer.

The interfacial layer may be formed around the nanostructures 106 and on the exposed portions of the base fin structures. The interfacial layer may be made of silicon oxide, and the interfacial layer may be formed by thermal oxidation.

The gate dielectric layer 160*a* may be formed over the interfacial layer, so that the nanostructures 106 are surrounded (e.g. wrapped) by the gate dielectric layer 160*a*. In addition, the gate dielectric layer 160*a* also covers the sidewalls of the gate spacer layers 136 and the inner spacer 139 in accordance with some embodiments. The gate dielectric layer 160*a* may be made of one or more layers of dielectric materials, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other applicable high-k dielectric materials, or a combination thereof. The gate dielectric layer 160*a* may be formed using CVD, ALD, other applicable methods, or a combination thereof. In some embodiments, the shell structure 152 is in direct contact with the gate dielectric layer 160*a*.

Next, the work function layer 160*b* is conformally formed over the gate dielectric layer 160*a*, as shown in FIGS. 1M, 1M-1 and 1M-2 in accordance with some embodiments. The work function layer 160*b* may be made of a metal material. The metal material of the work function layer 160*b* formed in the second region in the substrate 102 may include an N-work-function metal. The N-work-function metal may include tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), or a combination thereof.

The metal material of the work function layer 160*b* formed in the first region in the substrate 102 may include a P-work-function metal. The P-work-function metal may include titanium nitride (TiN), tungsten nitride (WN), tantalum nitride (TaN), ruthenium (Ru), or a combination thereof. The work function layer 160*b* may be formed using CVD, ALD, other applicable methods, or a combination thereof.

Next, a gate electrode layer may be formed over the work function layer 160*b*. The gate electrode layer may be made of one or more layers of conductive material, such as aluminum, copper, titanium, tantalum, tungsten, cobalt, molybdenum, tantalum nitride, nickel silicide, cobalt silicide, TIN, WN, TiAl, TiAlN, TaCN, TaC, TaSiN, metal alloys, another suitable material, or a combination thereof. The gate electrode layer may be formed using CVD, ALD, electroplating, another applicable method, or a combination thereof. After the gate electrode layer is formed, a planarization process such as CMP or an etch-back process may be performed.

Next, an opening may be formed in the ILD structure 146 over the source/drain epitaxial structures 138. A barrier layer may be conformally formed over the bottom surface and the sidewalls of the opening. The barrier layer may be formed before filling the conductive material in the opening to prevent the conductive material from diffusing out. The barrier layer may also serve as an adhesive or glue layer. The material of the barrier layer may be TiN, Ti, other applicable materials, or a combination thereof. The barrier layer may be formed by depositing the barrier layer materials by a physical vapor deposition process (PVD) (e.g., evaporation or sputtering), an atomic layer deposition process (ALD), an electroplating process, other applicable processes, or a combination thereof.

Next, a silicide structure may be formed in the source/drain epitaxial structure 138. The silicide structure may reduce the contact resistance between the source/drain epitaxial structure 138 and the subsequently formed contact structure over the source/drain epitaxial structure 138.

The silicide structure may be made of TiSi, $Ti_5Si_4$, $TiSi_2$, NiSi, $NiSi_2$, CoSi, $CoSi_2$, $WSi_2$ and $MoSi_2$, or other suitable low-resistance materials. The silicide structure may be formed over the source/drain epitaxial structure 138 by forming a metal layer over the source/drain epitaxial structure 138 first. The metal layer may react with the source/drain epitaxial structure 138 in an annealing process and a silicide layer may be produced. Afterwards, the unreacted metal layer may be removed in an etching process and the silicide structure may be formed over the source/drain epitaxial structure 138.

Afterwards, a contact structure 162 is formed into the opening over the first source/drain epitaxial structure 138*a* and the second source/drain epitaxial structure 138*b*, as shown in FIGS. 1M, 1M-1 and 1M-2 in accordance with some embodiments.

The contact structure 162 may be made of a metal material (e.g., Co, Ni, W, Ti, Ta, Cu, Al, Ru, Mo, TiN, TaN, and/or a combination thereof), metal alloys, poly-Si, other applicable conductive materials, or a combination thereof. The contact structure 162 may be formed by a CVD process, a PVD process, an ALD, an electroplating process, another suitable process, or a combination thereof to deposit the conductive materials of the contact structure 162, and then a planarization process such as a chemical mechanical polishing (CMP) process or an etch back process is optionally performed to remove excess conductive materials. After the planarization process, the top surface of the contact structure 162 may be level with the top surface of the gate spacer layers 136.

By forming a shell structure 152 between the gate structure 160 and the isolation gate structure 156, the isolation gate structure 156 may not be damaged when forming the gate structure 160. Therefore, leakage current may be prevented.

Many variations and/or modifications may be made to the embodiments of the disclosure. FIG. 2 is a cross-sectional representation of a semiconductor device structure 10*b*. Some processes or devices are the same as, or similar to, those described in the embodiments above, and therefore the descriptions of these processes and devices are not repeated herein. The difference from the embodiments described above is that, as shown in FIG. 2 in accordance with some embodiments, the isolation gate structure 156 is a single layer structure.

The isolation gate structure 156 may be formed by depositing the isolation gate structure material 156, and a planarization process is performed. In some embodiments, the single layer isolation gate structure 156 includes oxides.

By forming a shell structure 152 between the gate structure 160 and the isolation gate structure 156, the isolation gate structure 156 may not be damaged when forming the gate structure 160. Therefore, leakage current may be prevented. The isolation gate structure 156 may be a single layer structure.

Figure 3:
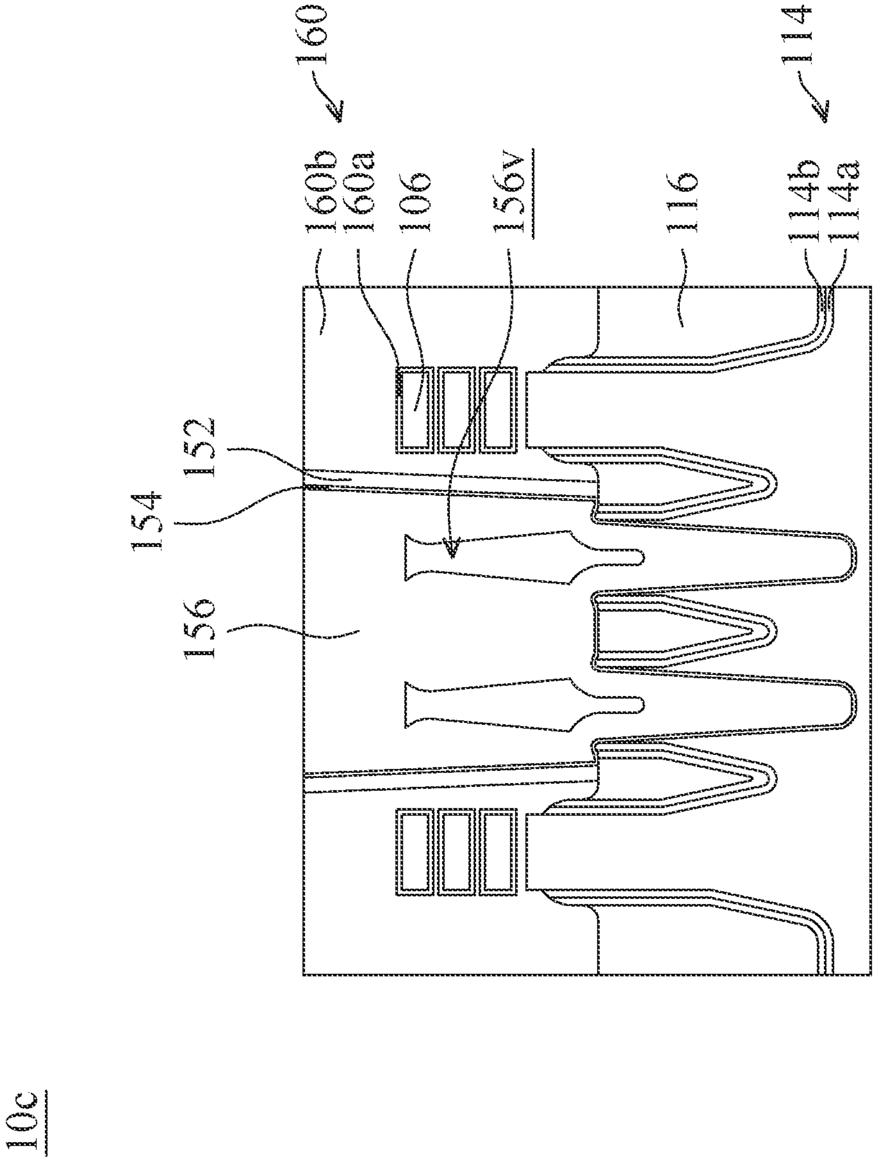
FIG. 3 is cross-sectional representation of a semiconductor device structure, in accordance with some embodiments of the disclosure.

Many variations and/or modifications may be made to the embodiments of the disclosure. FIG. 3 is a cross-sectional representation of a semiconductor device structure 10*c*. Some processes or devices are the same as, or similar to, those described in the embodiments above, and therefore the descriptions of these processes and devices are not repeated herein. The difference from the embodiments described above is that, as shown in FIG. 3 in accordance with some embodiments, a void 156*v* is formed in the isolation gate structure 156.

The isolation gate structure 156 may be formed by conformally depositing the isolation gate structure material 156. The void 156*v* may be formed in the isolation gate structure material 156 when depositing the isolation gate structure material 156.

By forming a shell structure 152 between the gate structure 160 and the isolation gate structure 156, the isolation gate structure 156 may not be damaged when forming the gate structure 160. Therefore, leakage current may be prevented. The void 156*v* may be formed in the isolation gate structure 156.

Figure 4:
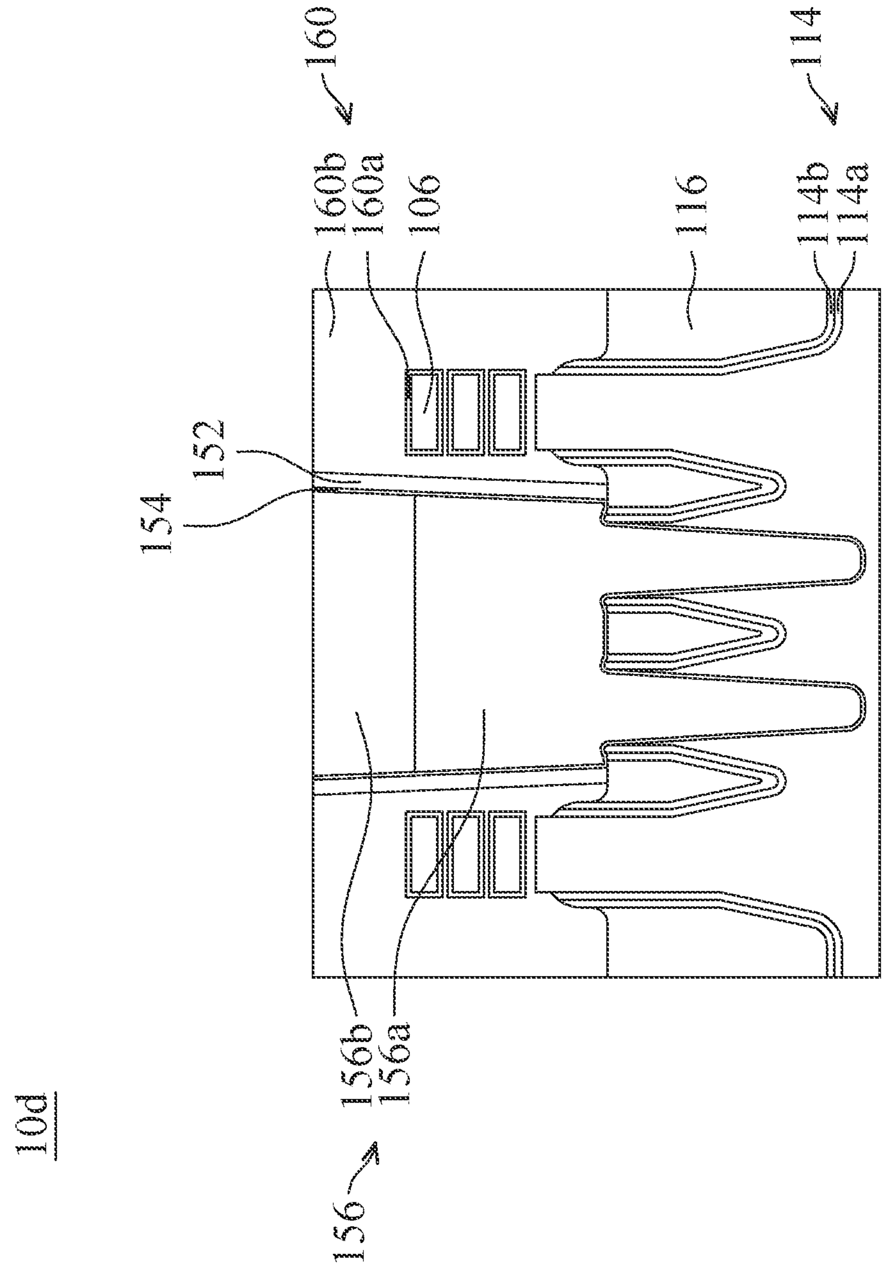
FIG. 4 is cross-sectional representation of a semiconductor device structure, in accordance with some embodiments of the disclosure.

Many variations and/or modifications may be made to the embodiments of the disclosure. FIG. 4 is a cross-sectional representation of a semiconductor device structure 10*d*. Some processes or devices are the same as, or similar to, those described in the embodiments above, and therefore the descriptions of these processes and devices are not repeated herein. The difference from the embodiments described above is that, as shown in FIG. 4 in accordance with some embodiments, the isolation structure 116 is not recessed when etching back the fin structures 112.

In some embodiments, the top surface of the isolation structure 116 under the shell structure 152 is substantially level with the top surface of the isolation structure 116 under the isolation gate structure 156. In some embodiments, the bottom surface of the shell structure 156 is lower than the bottommost surface of the nanostructures 106.

It should be noted that, the boundary between the first isolation gate structure layer 156*a* and the second isolation gate structure layer 156*b* may be higher than the top surface of the isolation structure 116, depends on the process demands.

By forming a shell structure 152 between the gate structure 160 and the isolation gate structure 156, the isolation gate structure 156 may not be damaged when forming the gate structure 160. Therefore, leakage current may be prevented. The isolation structure 116 may not be recessed when etching back the fin structures 112.

Figure 5A:
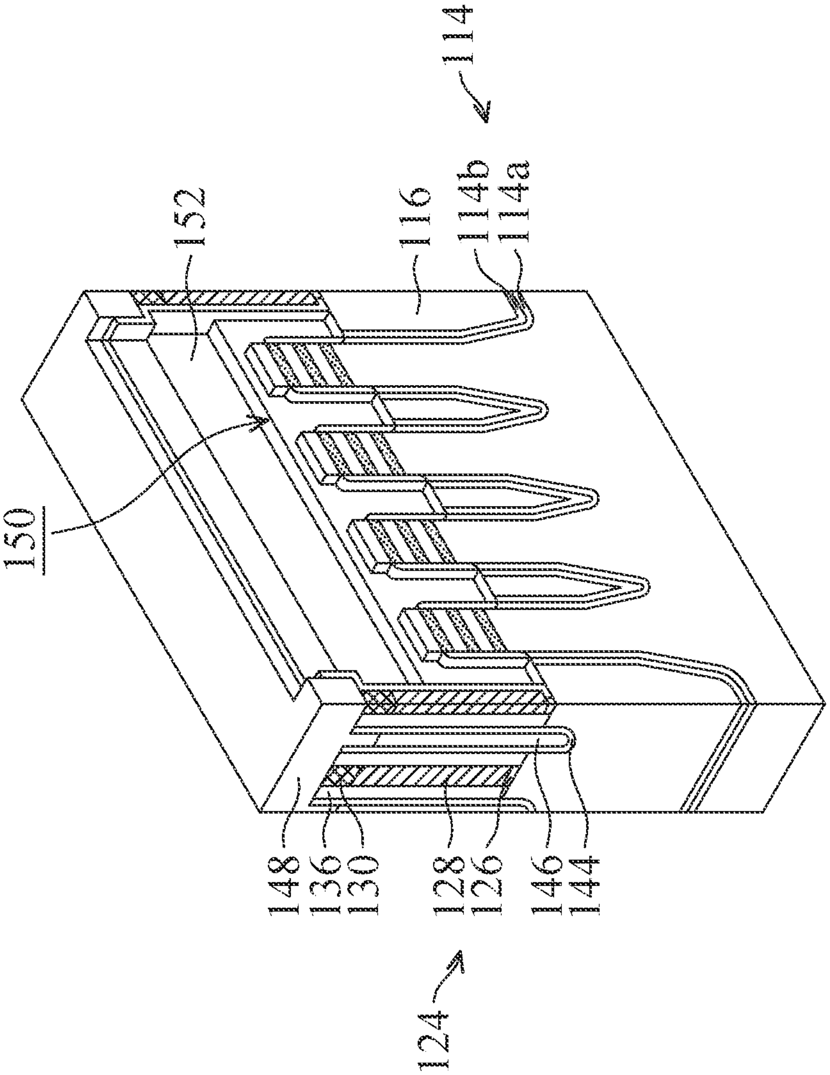
FIGS. 5A, 5B are perspective representations of various stages of forming a semiconductor device structure, in accordance with some embodiments of the disclosure.
Figure 5B:
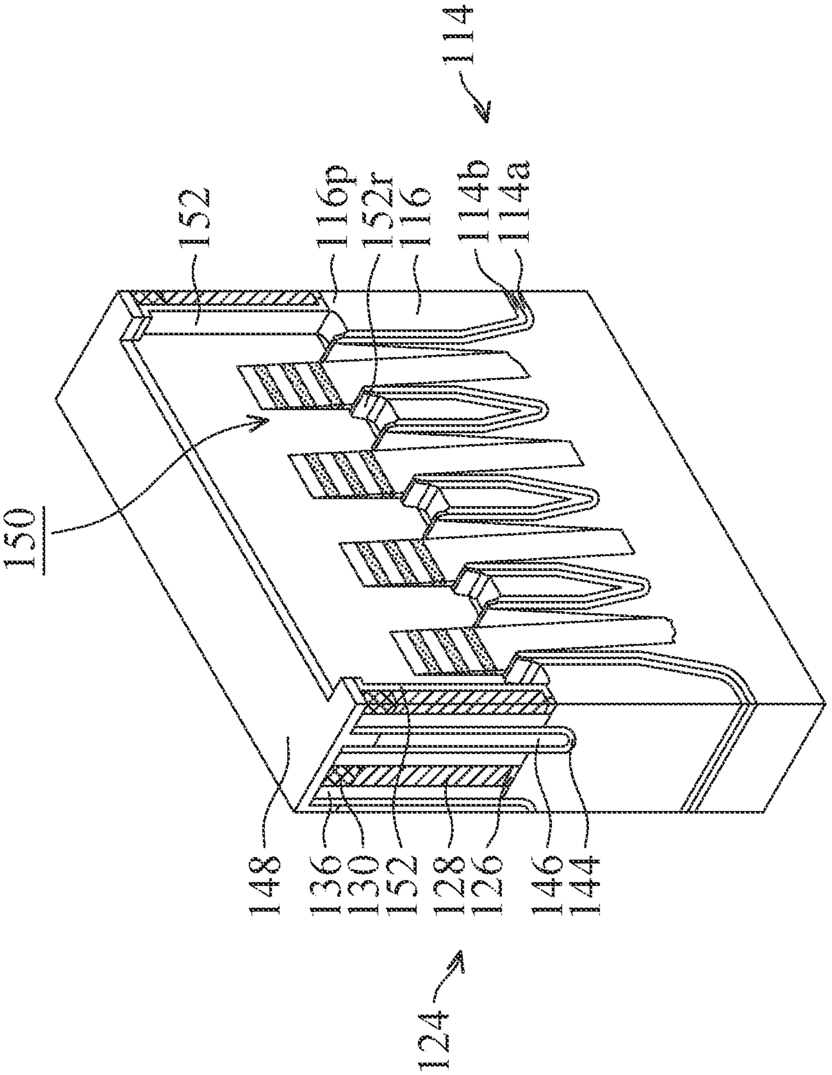

Many variations and/or modifications may be made to the embodiments of the disclosure. FIGS. 5A, 5B are perspective representations of various stages of forming a semiconductor device structure 10*e*. Some processes or devices are the same as, or similar to, those described in the embodiments above, and therefore the descriptions of these processes and devices are not repeated herein. The difference from the embodiments described above is that, as shown in FIG. 5B in accordance with some embodiments, a remain portion 152*r* of the shell material 152 remains over the liner layers 114 over the isolation structure 116.

The shell material 152 may be etched back, and the shell material 152 over the top surfaces of the fin structures 112 and the isolation structure 116 are removed, as shown in FIG. 5A in accordance with some embodiments. The top portion of the sidewalls the fin structures 112 may be also exposed from the shell material 152.

Next, the shell material 152 and the fin structures 112 exposed in the opening 150 are etched back, as shown in FIG. 5B in accordance with some embodiments. In some embodiments, the remain portion 152*r* of the shell material 152 remains over the liner layers 114 over the isolation structure 116. In some embodiments, the remain portion 152*r* of the shell material 152 is also formed over the remain spacer layers 136.

Figure 5C:
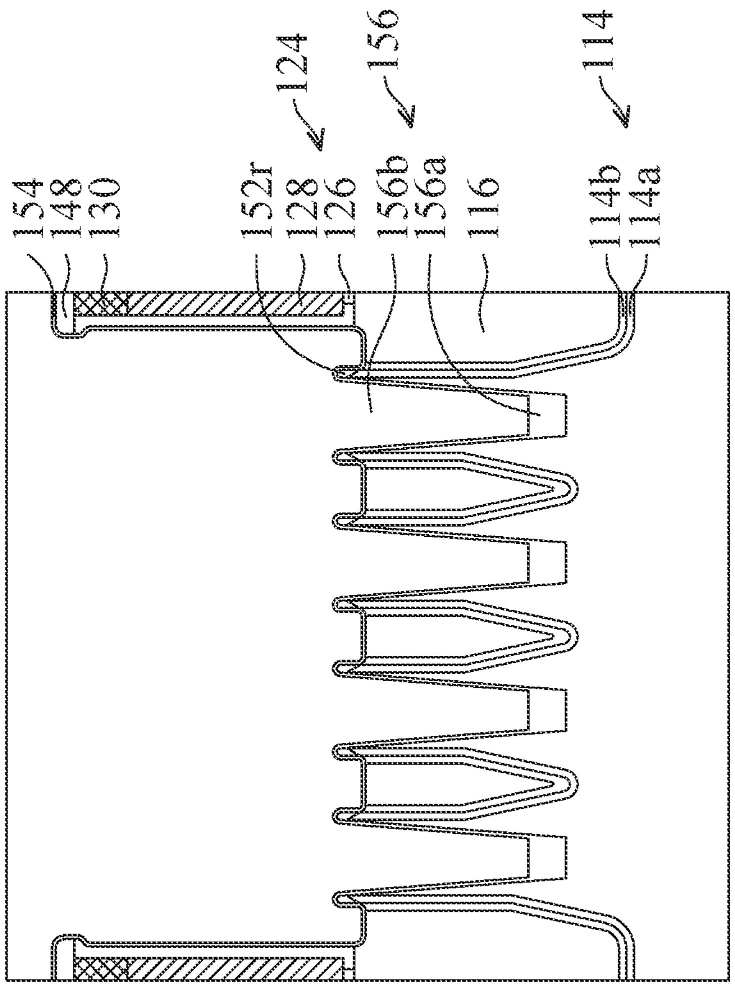
Figures 1, 5C:
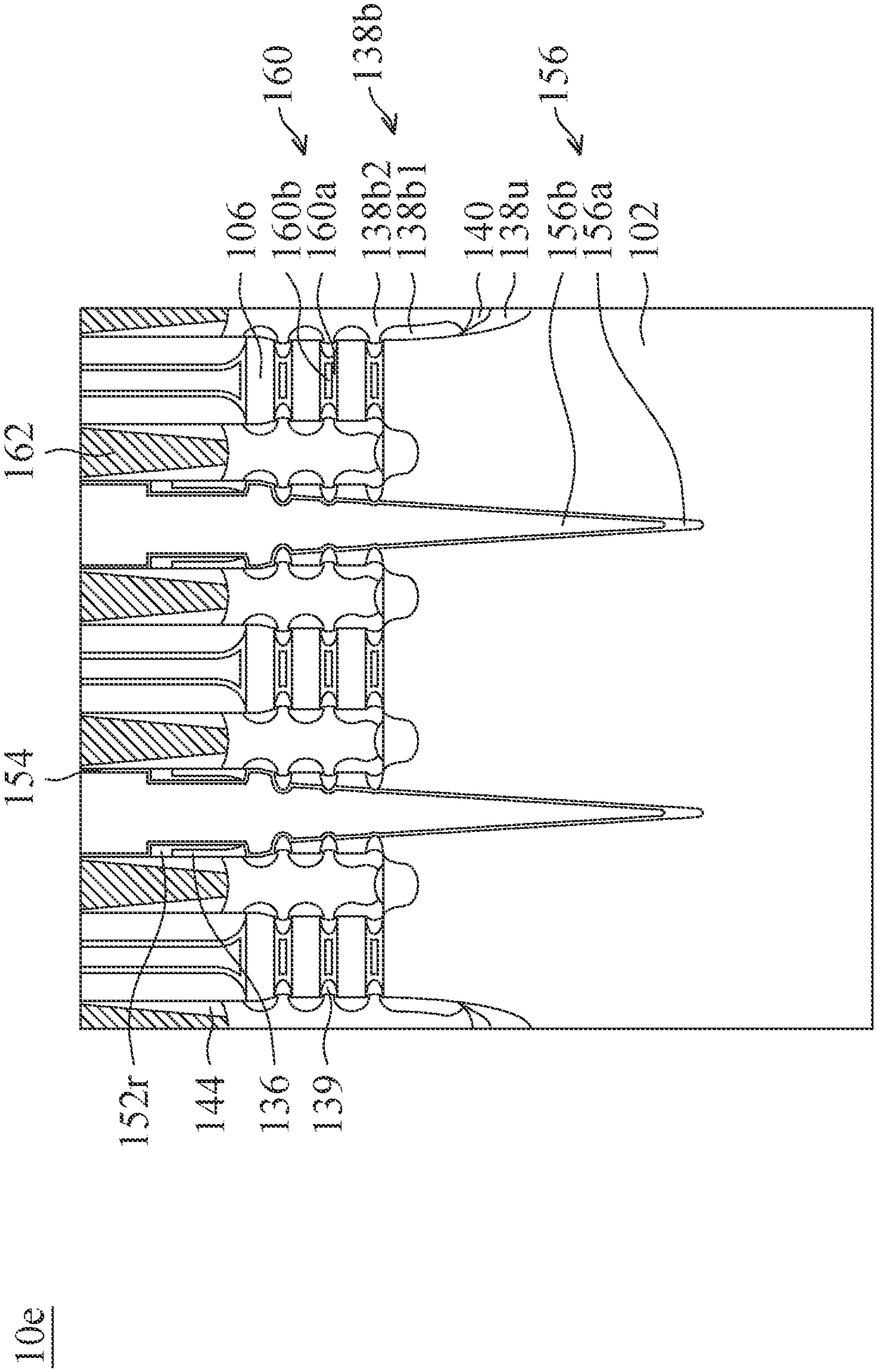

Afterwards, the isolation gate structure 156 is formed over the remain portion 152r of the shell structure 152 as shown in FIGS. 5C and 5C-1 in accordance with some embodiments.

By forming a shell structure 152 between the gate structure 160 and the isolation gate structure 156, the isolation gate structure 156 may not be damaged when forming the gate structure 160. Therefore, leakage current may be prevented. The shell material 152 may remain over the liner layers 114 over the isolation structure 116 and the remain spacer layers 136.

As described previously, the shell structure 152 is formed over the sidewalls of the isolation gate structure 156. The isolation gate structure 156 may be not consumed when forming the gate structure 160. The leakage current may be prevented. In some embodiments as shown in FIG. 2, the isolation gate structure 156 is a single layer structure. In some embodiments as shown in FIG. 3, the void 156v is formed in the isolation gate structure 156. In some embodiments as shown in FIG. 4, the isolation structure 116 is not recessed when removing the fin structures 112. In some embodiments as shown in FIG. 5, a remain portion 152r of the shell structure 152 remains over the isolation structure 116 and the spacer layers 136.

Embodiments of a semiconductor device structure and a method for forming the same are provided. The shell structure formed over the sidewalls of the isolation gate structure may prevent the isolation gate structure from damaged when forming the gate structures. The leakage current may be reduced.

In some embodiments, a method for forming a semiconductor device structure is provided. The method for forming a semiconductor device structure includes forming a fin structure over a substrate. The method for forming a semiconductor device structure also includes forming a gate structure across the fin structure. The method for forming a semiconductor device structure also includes forming source/drain epitaxial structures over opposite sides of the gate structure. The method also includes forming a hard mask layer over the gate structure and the source/drain epitaxial structures. The method for forming a semiconductor device structure also includes removing a portion of the hard mask layer and the gate structure to form an opening. The method also includes laterally etching the gate structure to enlarge the opening under the hard mask layer. The method for forming a semiconductor device structure also includes depositing a shell material in the opening. The method for forming a semiconductor device structure also includes etching back the shell material to form a shell structure under the hard mask layer. The method for forming a semiconductor device structure also includes forming an isolation gate structure in the opening.

In some embodiments, a method for forming a semiconductor device structure is provided. The method for forming a semiconductor device structure includes forming a fin structure extending in a first direction over a substrate. The method for forming a semiconductor device structure also includes forming an isolation structure surrounding a bottom portion of the fin structure. The method for forming a semiconductor device structure also includes forming a gate structure across the fin structure, wherein the gate structure extends in a second direction perpendicular to the first direction. The method for forming a semiconductor device structure also includes forming spacer layers over opposite sides of the gate structure. The method for forming a semiconductor device structure also includes forming source/drain epitaxial structures beside the gate structure. The method for forming a semiconductor device structure also includes forming an opening in the gate structure. The method for forming a semiconductor device structure also includes removing top portions of the spacer layers. The method for forming a semiconductor device structure also includes etching the gate structure in the second direction. The method for forming a semiconductor device structure also includes forming a shell structure over sidewalls of the gate structure in the second direction. The method for forming a semiconductor device structure also includes forming an isolation gate structure in the opening.

In some embodiments, a semiconductor device structure is provided. The semiconductor device structure includes nanostructures formed over a substrate. The semiconductor device structure also includes an isolation structure surrounding the substrate under the nanostructures. The semiconductor device structure also includes a gate structure wrapped around the nanostructures. The semiconductor device structure also includes source/drain epitaxial structures formed over opposite sides of the nanostructures. The semiconductor device structure also includes an isolation gate structure formed in the gate structure. The semiconductor device structure also includes a shell structure formed over the isolation structure and over the sidewalls of the isolation gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
- forming a fin structure over a substrate;
- forming a gate structure across the fin structure;
- forming source/drain epitaxial structures over opposite sides of the gate structure;
- forming a hard mask layer over the gate structure and the source/drain epitaxial structures;
- removing a portion of the hard mask layer and the gate structure to form an opening;
- laterally etching the gate structure to enlarge the opening under the hard mask layer;
- depositing a shell material in the opening;
- etching back the shell material to form a shell structure under the hard mask layer; and
- forming an isolation gate structure in the opening.

2. The method for forming the semiconductor device structure as claimed in claim 1, further comprising:
- forming spacer layers over sidewalls of the gate structure;
- trimming the spacer layers from the opening.

3. The method for forming the semiconductor device structure as claimed in claim 2, wherein bottom portions of the spacer layers remain after trimming the spacer layers.

4. The method for forming the semiconductor device structure as claimed in claim 1, further comprising:
- forming a shell liner layer after etching back the shell material.

5. The method for forming the semiconductor device structure as claimed in claim 4, wherein the shell liner layer is a multi-layer structure.

6. The method for forming the semiconductor device structure as claimed in claim 1, further comprising:
filling a first refilling material in the opening;
etching back the first refilling material; and
filling the second refilling material over the first refilling material.

7. The method for forming the semiconductor device structure as claimed in claim 1, further comprising:
removing the fin structure in the opening when etching back the shell material.

8. A method for forming a semiconductor device structure, comprising:
forming a fin structure extending in a first direction over a substrate;
forming an isolation structure surrounding a bottom portion of the fin structure;
forming a gate structure across the fin structure, wherein the gate structure extends in a second direction perpendicular to the first direction;
forming spacer layers over opposite sides of the gate structure;
forming source/drain epitaxial structures beside the gate structure;
forming an opening in the gate structure;
removing top portions of the spacer layers;
etching the gate structure in the second direction;
forming a shell structure over sidewalls of the gate structure in the second direction; and
forming an isolation gate structure in the opening.

9. The method for forming the semiconductor device structure as claimed in claim 8, further comprising:
forming a liner layer surrounding the isolation structure, wherein the shell structure is formed over the liner layer.

10. The method for forming the semiconductor device structure as claimed in claim 8, further comprising:
removing a gate dielectric layer of the gate structure after etching the gate structure in the second direction.

11. The method for forming the semiconductor device structure as claimed in claim 8, further comprising:
etching the fin structures and the isolation structure before forming an isolation gate structure in the opening.

12. The method for forming the semiconductor device structure as claimed in claim 11, wherein the opening is enlarged in the first direction when etching the fin structures and the isolation structure.

13. The method for forming the semiconductor device structure as claimed in claim 8, wherein the isolation gate structure is a multi-layer structure.

14. A semiconductor device structure, comprising:
nanostructures formed over a substrate;
an isolation structure surrounding the substrate under the nanostructures;
a gate structure wrapped around the nanostructures;
source/drain epitaxial structures formed over opposite sides of the nanostructures;
an isolation gate structure formed in the gate structure; and
a shell structure formed over the isolation structure and over the sidewalls of the isolation gate structure.

15. The semiconductor device structure as claimed in claim 14, wherein the isolation gate structure is wider than the shell structure.

16. The semiconductor device structure as claimed in claim 14, wherein a bottom surface of the shell structure is lower than a bottommost surface of the nanostructures.

17. The semiconductor device structure as claimed in claim 14, wherein the shell structure is in direct contact with the gate structure.

18. The semiconductor device structure as claimed in claim 14, wherein the isolation gate structure protrudes into the substrate beside the isolation structure.

19. The semiconductor device structure as claimed in claim 14, wherein the isolation structure has a protruding portion in direct contact with the shell structure.

20. The semiconductor device structure as claimed in claim 14, wherein the isolation gate structure comprises:
a first isolation gate structure layer; and
a second isolation gate structure layer,
wherein the boundary between the first isolation gate structure layer and the second isolation gate structure layer is substantially parallel to a top surface of the isolation gate structure.

* * * * *